US010054639B2

(12) United States Patent
Whetsel

(10) Patent No.: US 10,054,639 B2
(45) Date of Patent: Aug. 21, 2018

(54) TEST ACCESS PORT AND TCK INVERTER FOR SHADOW ACCESS PORT

(71) Applicant: TEXAS INSTRUMENTS INCORPORATED, Dallas, TX (US)

(72) Inventor: Lee D. Whetsel, Parker, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 15/609,950

(22) Filed: May 31, 2017

(65) Prior Publication Data

US 2017/0261553 A1 Sep. 14, 2017

Related U.S. Application Data

(62) Division of application No. 14/853,315, filed on Sep. 14, 2015, now Pat. No. 9,696,378, which is a division of application No. 14/543,411, filed on Nov. 17, 2014, now Pat. No. 9,164,146, which is a division of application No. 13/469,812, filed on May 11, 2012,
(Continued)

(51) Int. Cl.
*G01R 31/3177* (2006.01)
*G01R 31/3185* (2006.01)

(52) U.S. Cl.
CPC . *G01R 31/3177* (2013.01); *G01R 31/318536* (2013.01); *G01R 31/318544* (2013.01); *G01R 31/318555* (2013.01)

(58) Field of Classification Search
CPC .......... G01R 31/3177; G01R 31/31721; G01R 31/318575; G01R 31/318577; G01R 31/318544; G01R 31/318536; G01R 31/318555; G01R 31/318558; G01R 31/2851; G01R 31/28; G11C 29/48
See application file for complete search history.

(56) References Cited

U.S. PATENT DOCUMENTS 5,483,518 A    1/1996   Whetsel
5,900,753 A *  5/1999   Cote .................... G06F 5/06
                                                  327/144
(Continued)

OTHER PUBLICATIONS

Joshi, R.N.; Williams, K.L.; Whetsel, L.;, "Evolution of IEEE 1149.1 addressable shadow protocol devices," Test conference, 2003. Proceedings. ITC 2003. International, vol. 2, No., pp. 160-166 vol. 2, Sep. 30-Oct. 2, 2003 doi: 10.11 09/TEST.2003.1271206 URL: http://ieeexplore.ieee.org/stamp/stamp.jsp?tp=&arnumber=1271206&isnumber=28462.

(Continued)

*Primary Examiner* — Cynthia Britt
(74) *Attorney, Agent, or Firm* — Lawrence J. Bassuk; Charles A. Brill; Frank D. Cimino

(57) ABSTRACT

The disclosure describes a novel method and apparatus for providing a shadow access port within a device. The shadow access port is accessed to perform operations in the device by reusing the TDI, TMS, TCK and TDO signals that are used to operate a test access port within the device. The presence and operation of the shadow access port is transparent to the presence and operation of the test access port. According to the disclosure, the shadow access port operates on the falling edge of the TCK signal while the test access port conventionally operates on the rising edge of the TCK signal.

4 Claims, 21 Drawing Sheets

Related U.S. Application Data now Pat. No. 8,918,687, which is a division of application No. 13/183,113, filed on Jul. 14, 2011, now Pat. No. 8,201,036, which is a division of application No. 12/408,284, filed on Mar. 20, 2009, now Pat. No. 8,006,151.

(60) Provisional application No. 61/040,337, filed on Mar. 28, 2008.

(56) References Cited

U.S. PATENT DOCUMENTS

| | | | |
|---|---|---|---|
| 6,052,808 | A | 4/2000 | Wu et al. |
| 6,073,254 | A | 6/2000 | Whetsel |
| 6,446,249 | B1 | 9/2002 | Wang et al. |
| 6,516,442 | B1 | 2/2003 | Wang et al. |
| 6,570,407 | B1 | 5/2003 | Sugisawa et al. |
| 6,591,369 | B1 | 7/2003 | Edwards et al. |
| 6,694,464 | B1 | 2/2004 | Quayle et al. |
| 6,751,764 | B1 | 6/2004 | Golshan et al. |
| 6,829,730 | B2 * | 12/2004 | Nadeau-Dostie ............ G01R 31/318563 714/30 |
| 6,968,408 | B2 | 11/2005 | Joshi et al. |
| 7,213,225 | B2 | 5/2007 | Roesner et al. |
| 7,725,791 | B2 | 5/2010 | Whetsel |
| 7,747,901 | B2 | 6/2010 | Swoboda |
| 7,795,899 | B1 | 9/2010 | Grohoski et al. |
| 8,201,036 | B2 | 6/2012 | Whetsel |
| 8,918,687 | B2 | 12/2014 | Whetsel |
| 2005/0144497 | A1 | 6/2005 | Song |
| 2007/0245180 | A1 | 10/2007 | Li |

OTHER PUBLICATIONS

Yuejian Wu; Liviu Galin;, "Shadow write and read for at-speed BIST of TOM SRAMs," Test Conference, 2001. Proceedings. International, vol., No., pp. 985-994, 2001, doi: 10.11 09/TEST. 2001.966723 URL: http://ieeexplore.ieee.org/stamp/stamp.jsp?tp=&arnumber=966723&isnumber=20866.

* cited by examiner ptions of the drawings, description of the disclosure, and claims are referred to the original document.

TEST ACCESS PORT AND TCK INVERTER FOR SHADOW ACCESS PORT

This application is a divisional of prior application Ser. No. 14/853,315, filed Sep. 14, 2015, now U.S. Pat. No. 9,696,378, issued Jul. 4, 2017;

Which was a divisional of prior application Ser. No. 14/543,411, filed Nov. 17, 2014, now U.S. Pat. No. 9,164,146, granted Oct. 20, 2015;

Which was a divisional of prior application Ser. No. 13/469,812, filed May 11, 2012, now U.S. Pat. No. 8,918,687, granted Dec. 23, 2014;

Which was a divisional of prior application Ser. No. 13/183,113, filed Jul. 14, 2011, now U.S. Pat. No. 8,201,036, granted Jun. 12, 2012;

Which was a divisional of prior application Ser. No. 12/408,284, filed Mar. 20, 2009, now U.S. Pat. No. 8,006,151, granted Aug. 23, 2011;

Which claims priority from Provisional Application No. 61/040,337, filed Mar. 28, 2008, and relates in general to devices using JTAG Test Access Ports and in particular to devices using JTAG Test Access Ports in combination with Shadow Access Ports.

FIELD OF THE DISCLOSURE

Background of the Disclosure

Most electrical devices today, which may be boards, ICs or embedded cores within ICs, use the IEEE 1149.1 standard (JTAG) TAP and interface to perform a variety of necessary operations, including but not limited to hardware test operations, hardware diagnostic operations, hardware/software debug operations, software trace operations and hardware programming operations. A number of additional IEEE standards have been created that also utilized the JTAG TAP interface to perform standardized operations beyond what the original JTAG TAP standard was designed to perform. Some of these additional IEEE standards include 1149.4, 1149.6, 1149.7, 1532, 1581, 1687, and 1500. The JTAG TAP interface of a device includes a test data input (TDI) terminal, a test clock (TCK) terminal, a test mode select (TMS) terminal, a test data output (TDO) terminal, and optionally a test reset (TRST) terminal. These device TAP interface terminals are dedicated and thus are available for enabling the above mentioned device operations at any point in the devices lifetime, i.e. device manufacturing through device system application.

FIG. 1 illustrates the standard JTAG TAP 100 within a device. The TAP 100 includes a TAP state machine (TSM) 102, an instruction register 104, data registers 106, TDO multiplexing circuitry 108, TDO output FF 110 and TDO output buffer 112. The TSM 102 has inputs coupled to the TMS 118 and TCK 120 device terminals and control outputs 103 coupled to the other circuits within the TAP. The TRST input of TSM 102 may be coupled to a TRST device terminal 124 or to an internal power on reset circuit (POR) 114. The instruction register 104 and data registers 106 have inputs coupled to the TDI 116 device terminal and have serial outputs coupled to multiplexer 108. The instruction register has outputs for, among other things, selecting one of the data registers for access. The data registers have inputs to and outputs from other circuits in the device. FF 110 has an input coupled to the output of multiplexer 108 and an output coupled to output buffer 112. When enabled, buffer 112 outputs data to the TDO device terminal 122.

The TMS, TCK and optional TRST terminals, are connected to the JTAG controller. The TDI terminal may be connected to the JTAG controller or to the TDO terminal of a leading device TAP in a series arrangement. The TDO terminal may be connected to the JTAG controller or to the TDI terminal of a trailing device TAP in a series arrangement. The TSM 102 responds to TMS and TCK according to the TAP state diagram of FIG. 3 to; (1) enter a Test Logic Reset state 302, (2) enter a Run Test/Idle state 304, (3) to perform a data register scan operation 306 from TDI to TDO, or (4) to perform an instruction scan operation 308 from TDI to TDO.

FIG. 2 illustrates a timing example of the TCK, TMS, TDI and TDO signals according to the IEEE 1149.1 standard. As seen, TMS, TDI and TDO signals transition on the falling edge of TCK and are sampled on the rising edge of TCK. The structure and operation of the TAP, its state diagram, and timing of its TDI, TCK, TMS and TDO signals are well known in the industry.

FIGS. 4-6 illustrate electronic systems 402, 502, 602, containing devices, each device containing a TAP 100. The electronic systems could be a board or other substrate with IC devices, an IC with embedded core devices, or a core with further embedded core devices. As seen in FIG. 4-6, a JTAG TAP controller may be coupled to the TAP 100 terminals of a single device (FIG. 4), to the TAP 100 terminals of a group of parallel arranged devices (FIG. 5), or to the TAP 100 terminals of a group of serially arranged devices (FIG. 6). In FIG. 5, a connection between a JTAG controller and the TAP terminals of a group of parallel arranged devices requires the JTAG controller to have a dedicated TMS signal for each of the parallel devices, so that each device TAP 100 can be separately accessed. For example, if 20 parallel devices are connected to a controller, the controller would have to have 20 TMS 118 signals, in addition to the TDI 116, TCK 120, and TDO 122 signals.

Today the instantiation of the IEEE 1149.1 Boundary Scan TAP in a device is performed automatically by design synthesis tools. These tools implement the 1149.1 TAP compliant with the rules of the IEEE 1149.1 standard. If users of a design synthesis tool wish to extend the automatic implementation of the IEEE 1149.1 TAP to support other, standardized or non-standardized, operations in a device, such as but not limited to debug, trace, and programming operations, they must manually modify or redesign the synthesized IEEE compliant 1149.1 TAP. Depending upon the level of extension, this can either be a simple or complex task, but nevertheless a manual one.

As will be described in detail below, the disclosure advantageously provides a method and apparatus that allows a user to extend the operations of a synthesized IEEE 1149.1 TAP without having to manually modify or redesign the synthesized IEEE 1149.1 TAP. The additional operations are realized by augmenting an IEEE 1149.1 TAP with a Shadow Access Port. As will be described below, the Shadow Access Port is designed to operate using the existing TDI, TCK, TMS and TDO interface signals of a device's IEEE 1149.1 TAP without effecting the operation of the IEEE 1149.1 TAP.

BRIEF SUMMARY OF THE DISCLOSURE

The disclosure provides a novel method and apparatus for augmenting a device 1149.1 TAP with a Shadow Access Port that can be used to perform operations beyond the operations performed by the 1149.1 TAP. The Shadow Access Port advantageously reuses the device TAP's existing TDI, TCK, TMS and TDO signals, so no additional device interface signals are required. As will be described below, the Shadow Access Port operates on the falling edge of TCK and in a manner that does not interfere with the rising edge operation of the device 1149.1 TAP.

DETAILED DESCRIPTION OF THE DISCLOSURE

Figure 1:
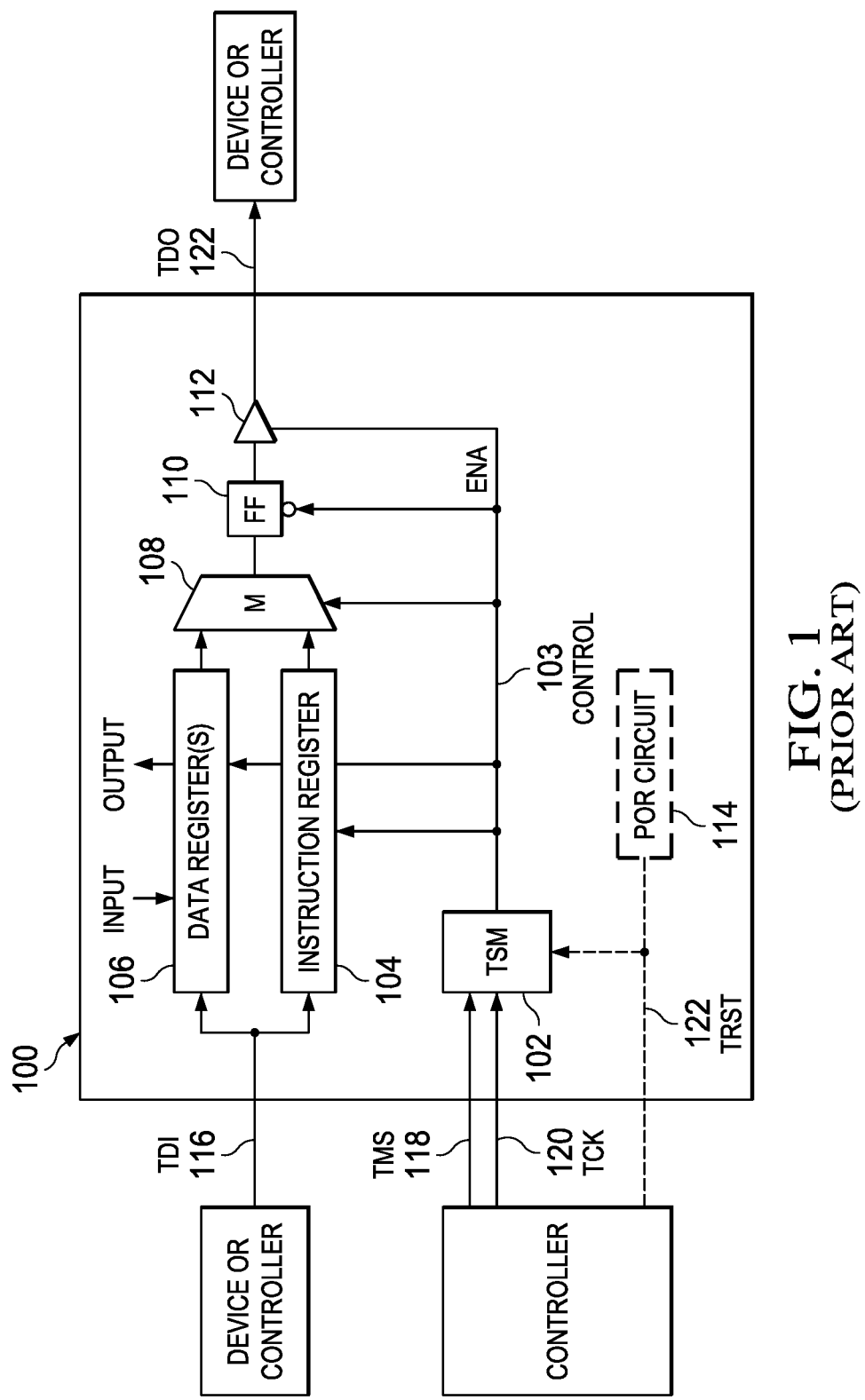
FIG. 1 illustrates a conventional IEEE standard 1149.1 (JTAG) test access port (TAP) of a device connected to a JTAG controller or other device TAPs.
Figure 7:
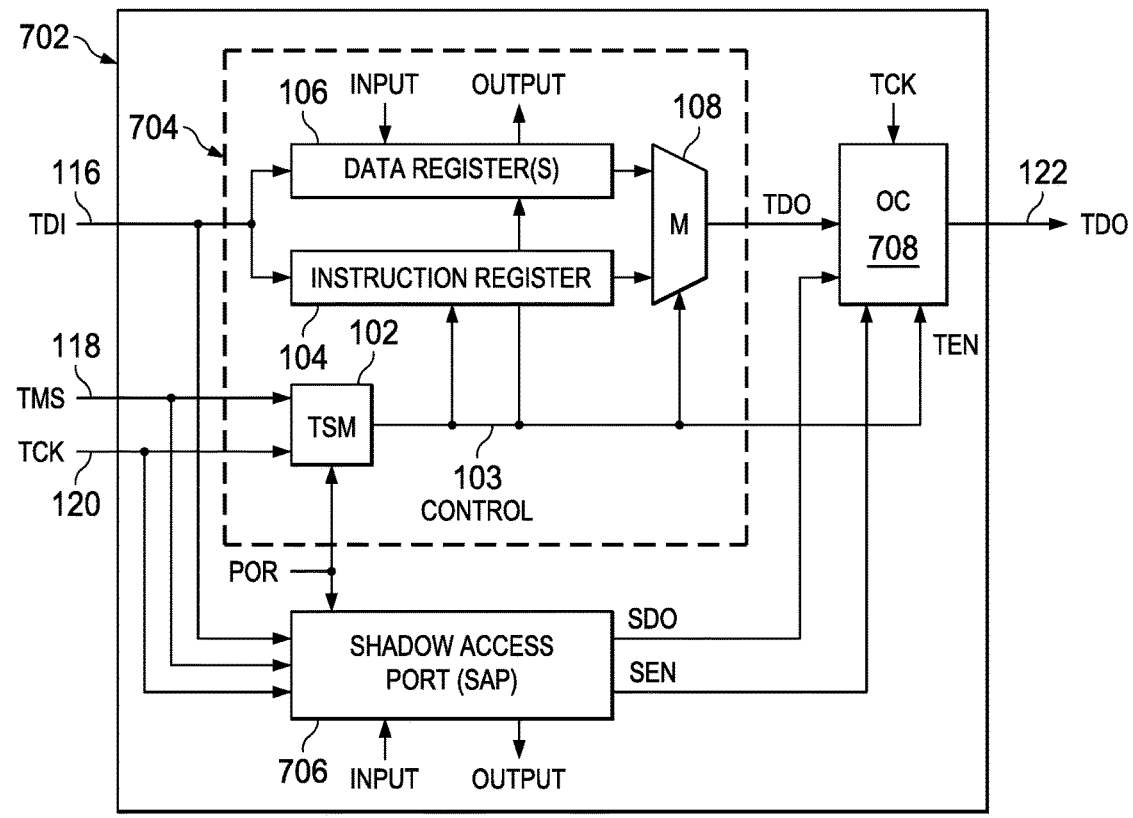
FIG. 7 illustrates an example implementation of a device containing a Test Access Port (TAP) and a Shadow Access Port (SAP) according to the disclosure.

FIG. 7 illustrates a device 702 containing a TAP 704 and a Shadow Access Port (SAP) 706 according to the present disclosure. The device 702 could be an IC or core realizing a DSP, CPU or other circuit function. TAP 704 is the same as TAP 100 of FIG. 1 with the exception that FF 110 and TDO buffer 112 have been removed from TDO output path of the TAP. The TDI 116 input of device 702 is coupled to TAP 704 and SAP 706. The TMS 118 input of device 702 is coupled to TAP 704 and SAP 706. The TCK 120 input of device 702 is coupled to TAP 704 and SAP 706. The TDO 122 output of the device is coupled to TAP 704 and SAP 706 via an output circuit (OC) 708. The output circuit 708 inputs the TDO and TDO enable (TEN) signals from TAP 704, the SAP data output (SDO) and SAP enable (SEN) signals from SAP 706, and TCK signal 120. The TRST input to the TAP 704 and reset input to the SAP 706 are coupled to a POR reset output from a power on reset circuit of the device 702. The POR signal resets the TAP 704 and SAP 706. As mentioned in regard to FIG. 1, the reset inputs could also be coupled to an optional device TRST input as well.

Figure 8:
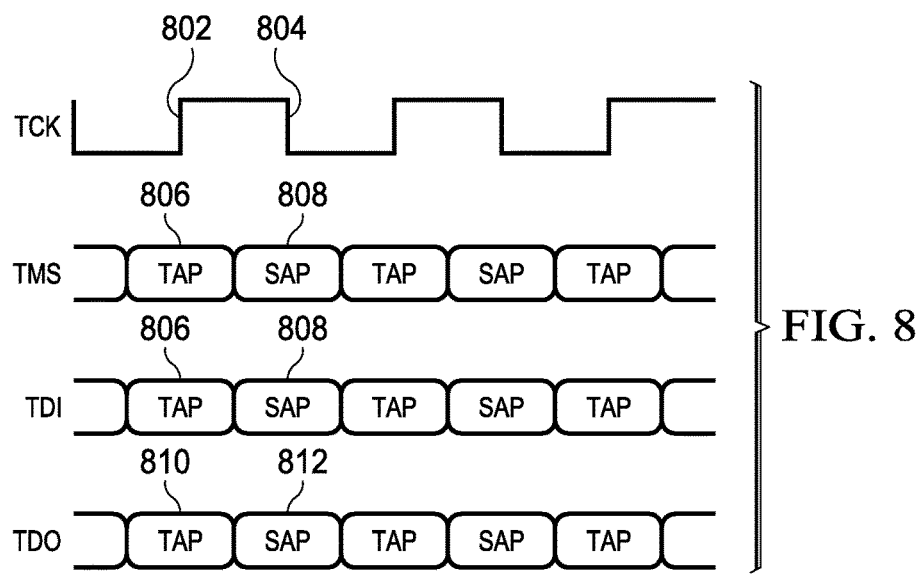
FIG. 8 illustrates the TCK, TMS, TDI and TDO timing of the TAP and SAP circuits of FIG. 7 according to the disclosure.

FIG. 8 illustrates the timing of the device's TDI, TCK, TMS and TDO signals to TAP 704 and SAP 706. The TAP 704 responds conventionally to TMS 118 on the rising edge 802 of TCK 120 to transition through states or to input data from TDI 116 and output data to TDO 122. The SAP 706, importantly and according to the disclosure, responds to TMS 118 on the falling edge 804 of TCK 120 to transition through states or to input data from TDO 116 and output data to TDO 122. To achieve the rising edge 802 TDI and TMS input to the TAP 704 and falling edge 804 TDI and TMS input to the SAP, a connected controller will be designed to input two data bits per TCK period on the TDI and TMS signals, one data bit 806 for the TAP 704 and one data bit 808 for the SAP 706. Each data bit will be presented to the TAP and SAP at an appropriate time prior to the rising 802 and falling 804 edges of the TCK, respectively. Also during data input and output operations, the controller will be designed to input data 810 from the TAP's TDO, via output circuit 708, on the rising edge 802 of TCK and to input data 812 from the SAP' SDO, via output circuit 708, on the falling edge 804 of TCK during each TCK period.

It should be understood from FIGS. 7 and 8 that the presence and operation of the SAP 706 is transparent to the conventional operation of the TAP 704 to input TMS and TDI signals and output TDO signals. Thus as the name implies, the SAP operates as a non-intrusive shadow circuit to the TAP within the device.

Figure 9A:
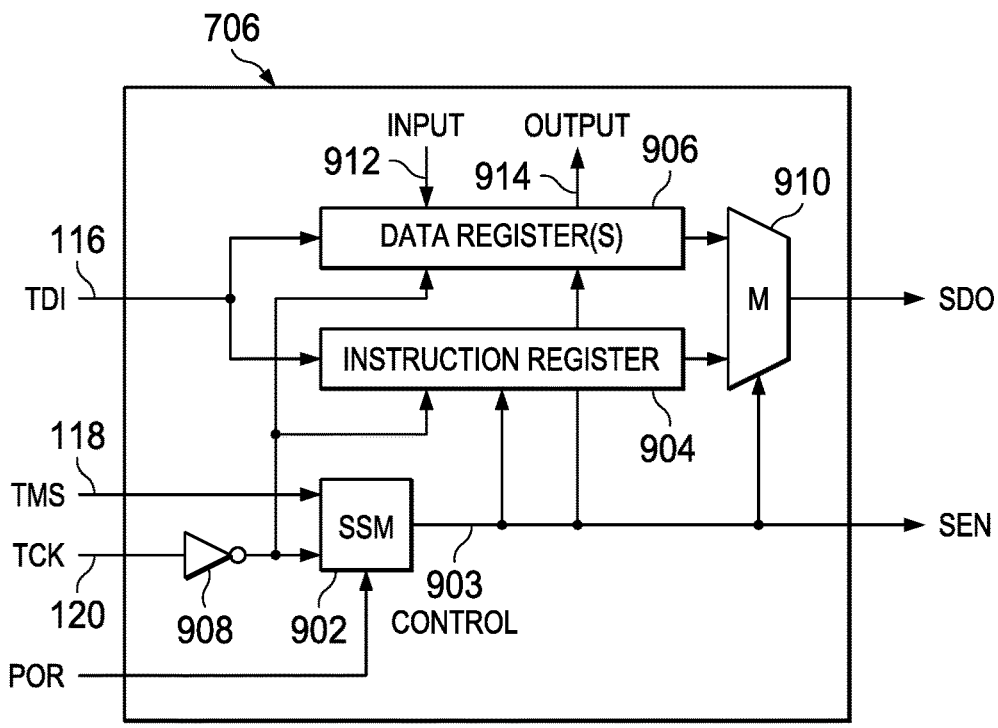
FIG. 9A illustrates an example implementation of the SAP circuit of FIG. 7.

FIG. 9A illustrates one example implementation of SAP 706 of FIG. 7, which includes a SAP state machine (SSM) 902, instruction register 904, data registers 906, inverter 908, and multiplexer circuitry 910. It should be understood that the SAP 706 is not limited to this one example implementation. The instruction register has a data input coupled to TDI, control inputs coupled to the control outputs 903 of SSM 902, a clock input coupled to the output of TCK inverter 908, and an output coupled to one input of multiplexer 910. While not shown, the instruction register has a parallel output that is used to select a data register 906 for access via TDI and TDO, and optionally a parallel input. Each data register 906 has an input coupled to TDI, control inputs coupled to the control outputs 903 of SSM 902, a clock input coupled to the output of TCK inverter 908, and an output coupled to an input of multiplexer 910. The data registers 906 have parallel inputs 912 and outputs 914 for communicating with circuitry within the device. Multiplexer circuitry 910 has an input for the instruction register 904 output, inputs for each data register 906 output, control inputs from the control outputs of SSM 902, and a SDO output. SSM 902 has an input coupled to the TMS signal, an input coupled to the TCK signal via inverter 908, an input coupled to the POR signal, and the aforementioned control outputs 903, which further include the SEN output of FIG. 7. As can be seen in reference to FIGS. 7 and 9, the SDO output from multiplexer 910 is input to output circuit 708 and the SEN output of SSM 902 is input to output circuit 708. The SAP 706 of FIG. 9A operates similar to the TAP 704 in that the SSM 902 controls TDI and TDO access to either the instruction register 904 or a selected data register 906.

Figure 10:
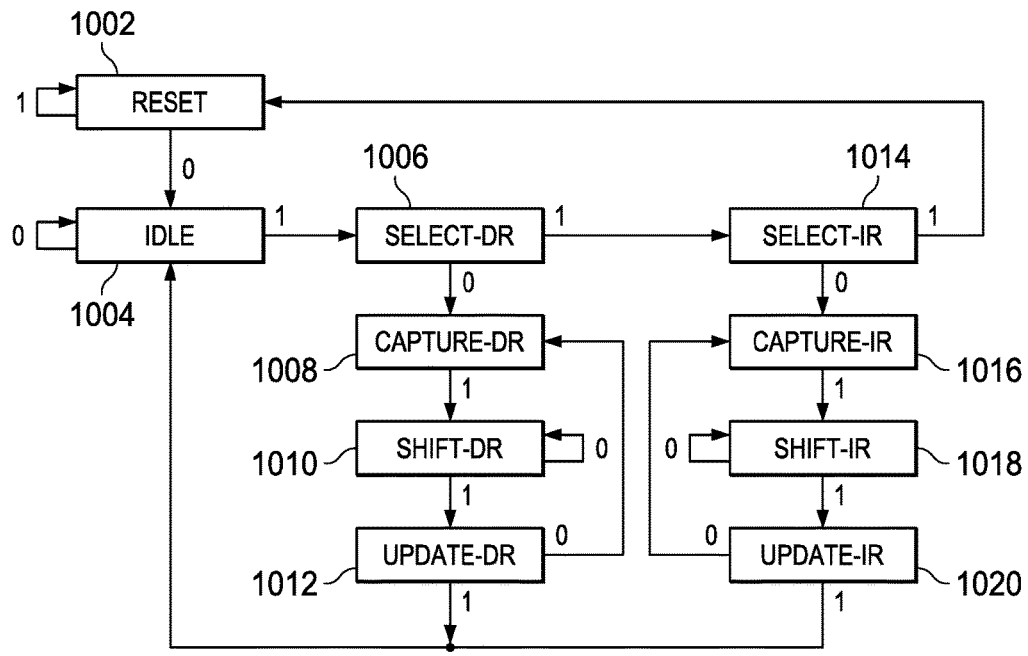
FIG. 10 illustrates an example state diagram of the operation of the SAP circuit of FIG. 9A.

FIG. 10 illustrates an example state diagram depicting the operation of SSM 902. SSM 902 responds to TMS 118 to transition through states on the falling edge of TCK 120. In response to a POR input, SSM 902 transitions to Reset state 1002. SSM 902 remains in the Reset state during each TCK falling edge while TMS is high. In the Reset state, SSM 902 outputs control to reset the instruction register 904 and optionally certain ones of or all of data registers 906. In the Reset state, the SEN signal, from the SSM 902 control output, is set to disable the output circuit 708 from driving the TDO output 122 of the device.

In response to a low on TMS, state machine 902 transitions from Reset state 1002 to Idle state 1004 and removes the reset condition from the instruction register and data registers. State machine 902 remains in Idle state 1004 while TMS is low. In response to a high on TMS, state machine 902 transitions to select data register (Select-DR) state 1006. Depending on the logic level of TMS, the state machine transitions from the Select-DR state to either the select instruction register (Select-IR) state 1014 (TMS=1) or the capture data register (Capture-DR) state 1008 (TMS=0). The following describes the results of these two transitions.

(1) Result of Select-DR to Capture-DR Transition

If state machine 902 transitions from Select-DR state 1006 to Capture-DR state 1008, the state machine outputs control to a selected data register 906 causing the data register to capture (load) data from its parallel inputs. From the Capture-DR state 1008, the state machine 902 transitions to the shift data register (Shift-DR) state 1010 to shift data through the selected data register from TDI 116 to TDO 122. While in the Shift-DR state, the state machine 902 sets the SEN signal to enable the output circuit 708 to output the data from the data register on TDO 122. The data shift operation continues while TMS is low. When the shift operation is complete TMS goes high causing state machine 902 to transition to the update data register (Update-DR) state 1012. In Update-DR state 1012, the state machine outputs control to the selected data register causing the data register to update (output) the data that was shifted in from TDI 116 on its parallel outputs. The state machine transitions from the Update-DR state 1012 to the Idle state 1004.

(2) Result of Select-DR to Select-IR Transition

If state machine 902 transitions from Select-DR state 1006 to the (Select-IR) state 1014, there are two transitions that can occur; (1) transition to the Reset state 1002 if TMS is high or (2) transition to the capture instruction register (Capture-IR) state 1016 if TMS is low. If TMS is high, the state machine transitions from the Select-IR state 1014 to Reset state 1002 and resets the instruction and data registers as mentioned above. If TMS is low, the state machine transitions from Select-IR state 1014 to capture instruction register (Capture-IR) state 1016. In the Capture state, the state machine outputs control to cause the instruction register to capture (load) data from its parallel inputs. From the Capture-IR state 1016, the state machine 902 transitions to the shift instruction register (Shift-IR) state 1018 to shift data through the instruction register from TDI 116 to TDO 122. While in the Shift-IR state, the state machine 902 sets the SEN signal to enable the output circuit 708 to output the data from the instruction register on TDO 122. The instruction shift operation continues while TMS is low. When the shift operation is complete TMS goes high causing state machine 902 to transition to the update instruction register (Update-IR) state 1020. In Update-IR state 1020, the state machine outputs control to the instruction register causing the instruction register to output the instruction that was shifted in from TDI 116 on its parallel outputs. The state machine transitions from the Update-IR state 1020 to the Idle state 1004.

Figure 3:
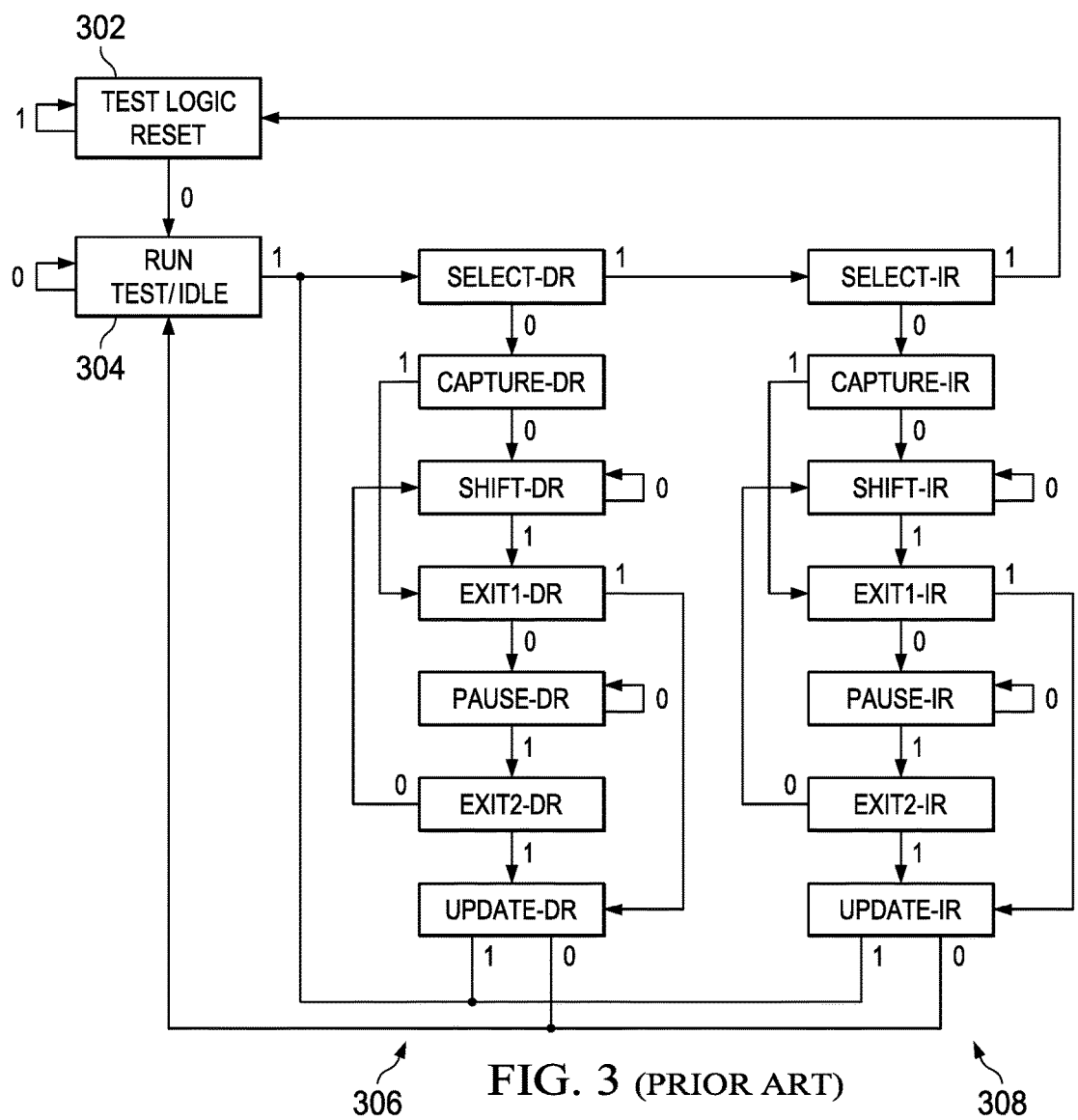
FIG. 3 illustrates the timing diagram of the state machine of a conventional 1149.1 TAP.
Figure 4:
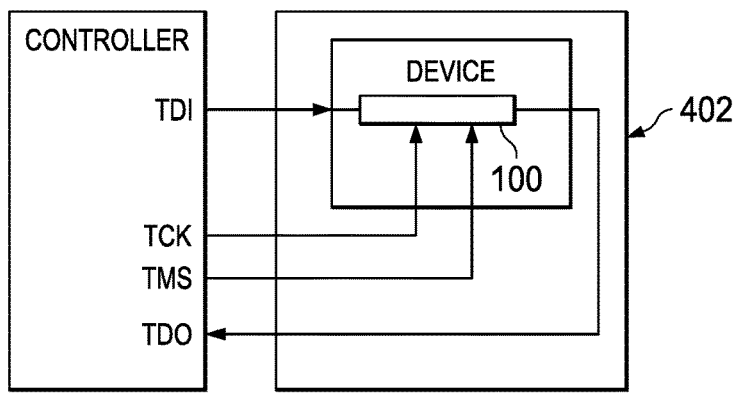
FIG. 4 illustrates a conventional connection between a controller and one device TAP.
Figure 5:
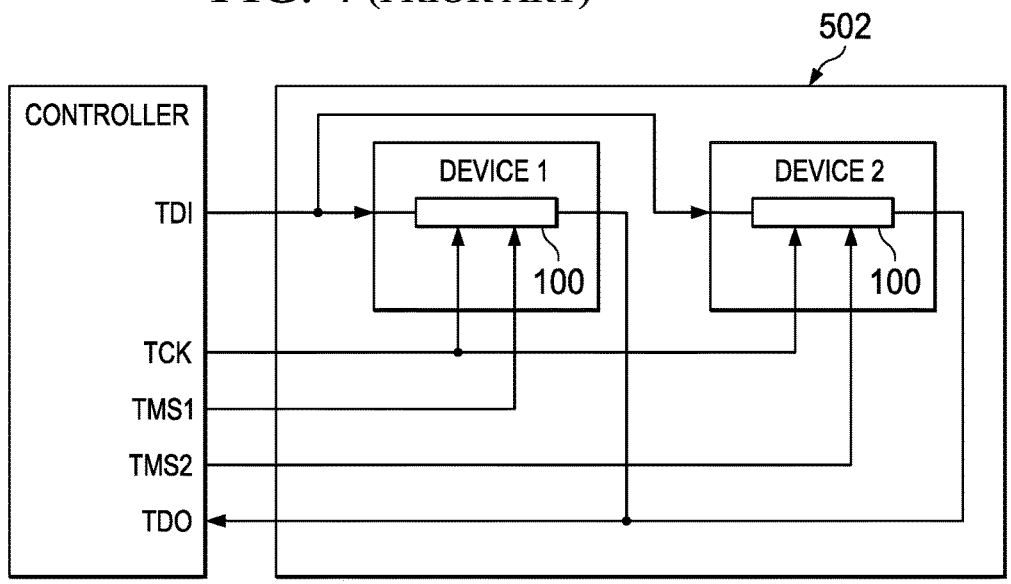
FIG. 5 illustrates a conventional parallel arrangement between a controller and multiple device TAPs.
Figure 6:
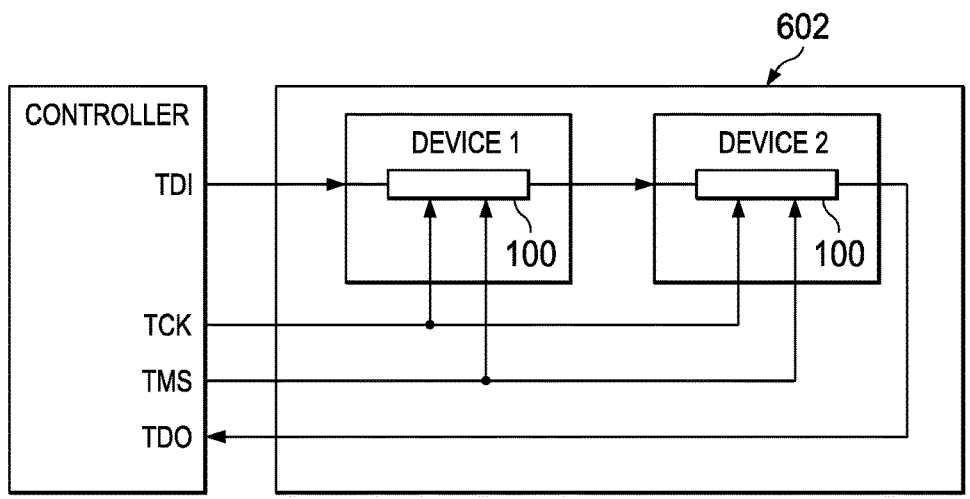
FIG. 6 illustrates a conventional serial arrangement between a controller and multiple device TAPs.

As seen in the example state diagram if FIG. 10, the state machine 902 has been designed to transition to Reset state 1002 from any of its states in 5 TCKs or less if the TMS signal is set high. This means state machine 902 will always transition to (i.e. return) to Reset state 1002 whenever TCK is active and the TMS signal is set high. This reset state return feature mimics the "return to reset" feature of the conventional 1149.1 TAP's TSM 102 which was designed to return to the Test Logic Reset state of FIG. 3 within 5 TCKs or less from any state in the diagram if TMS is set high. Thus the "return to reset" feature of the ATAP is advantageously identical to the "return to reset" feature of the conventional TAP's TSM 102, i.e. both state machines can be reset by simply setting TMS 118 high with TCK 120 running.

It should be noted that while the state diagram of FIG. 10 is used to illustrate the operation of state machine 902, the operation of state machine 902 is not limited to this particular state diagram. Indeed other state diagrams could be devised to implement the operation of state machine 902, including the state machine diagram of FIG. 3, without departing from the spirit or scope of the present disclosure.

Figure 11A:
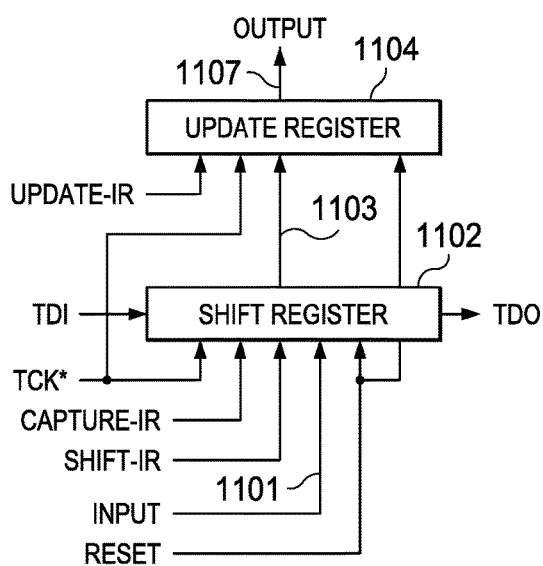
FIG. 11A illustrates an example implementation of the SAP instruction register.

FIG. 11A illustrates a more detail example of the instruction register 904 which comprises a shift register 1102 and an update register 1104 connected as shown. The shift register has an input for TDI, an input for the inverted TCK (TCK*), an input for a Capture-IR signal from the SSM 902 control bus, an input for a Shift-IR signal from the SSM 902 control bus, an optional input for a Reset signal from the SSM 902 control bus, parallel inputs 1101, an output for TDO, and parallel instruction outputs 1103 coupled to parallel instruction inputs of the Update register 1104. The update register has an input for an Update-IR signal from the SSM 902 control bus, an input for the inverted TCK (TCK*) signal, parallel inputs 1103 from shift register 1102, a Reset input from the SSM 902 control bus, and parallel outputs 1107 for outputting an instruction. As mentioned, the instruction output 1107 from update register 1104 is used to at least control the selection of a data register 906 for access between TDI and TDO. However the instruction output may be used to control other circuits within the device as well. When the instruction register is reset by the Reset input from SSM 902, the update register 1104 is set to output an instruction on its parallel outputs 1107 that selects a particular data register to be coupled between TDI and TDO, such as a single bit bypass data register as described in IEEE standard 1149.1. The shift register 1102 may also be reset by the Reset signal if desired.

Figure 11B:
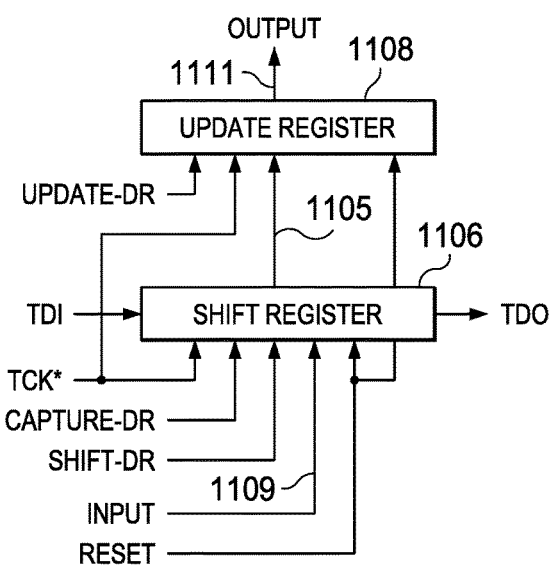
FIG. 11B illustrates a first example implementation of a SAP data register.

FIG. 11B illustrates a more detail example of a data register 906 which comprises a shift register 1106 and an update register 1108 connected as shown. The shift register has an input for TDI, an input for the inverted TCK (TCK*), an input for a Capture-DR signal from the SSM 902 control bus, an input for a Shift-DR signal from the SSM 902 control bus, an optional input for a Reset signal from the SSM 902 control bus, parallel inputs 1109, an output for TDO, and parallel outputs 1105 coupled to parallel inputs of the update register 1108. The update register 1108 has an input for an Update-DR signal from the SSM 902 control bus, an input for the inverted TCK (TCK*) signal, parallel inputs 1105 from shift register 1106, an optional Reset input from the SSM 902 control bus, and parallel outputs 1111. As mentioned, the parallel inputs 1109 to shift register 1106 are used to input parallel data from a circuit within a device and the parallel outputs 1111 from update register 1108 are used to output parallel data to a circuit within a device. The circuit of the device coupled to the input 1109 and output 1111 of the data register could be a circuit being tested, a debug circuit, a trace circuit, a circuit to be programmed, or a functional circuit.

Figure 11C:
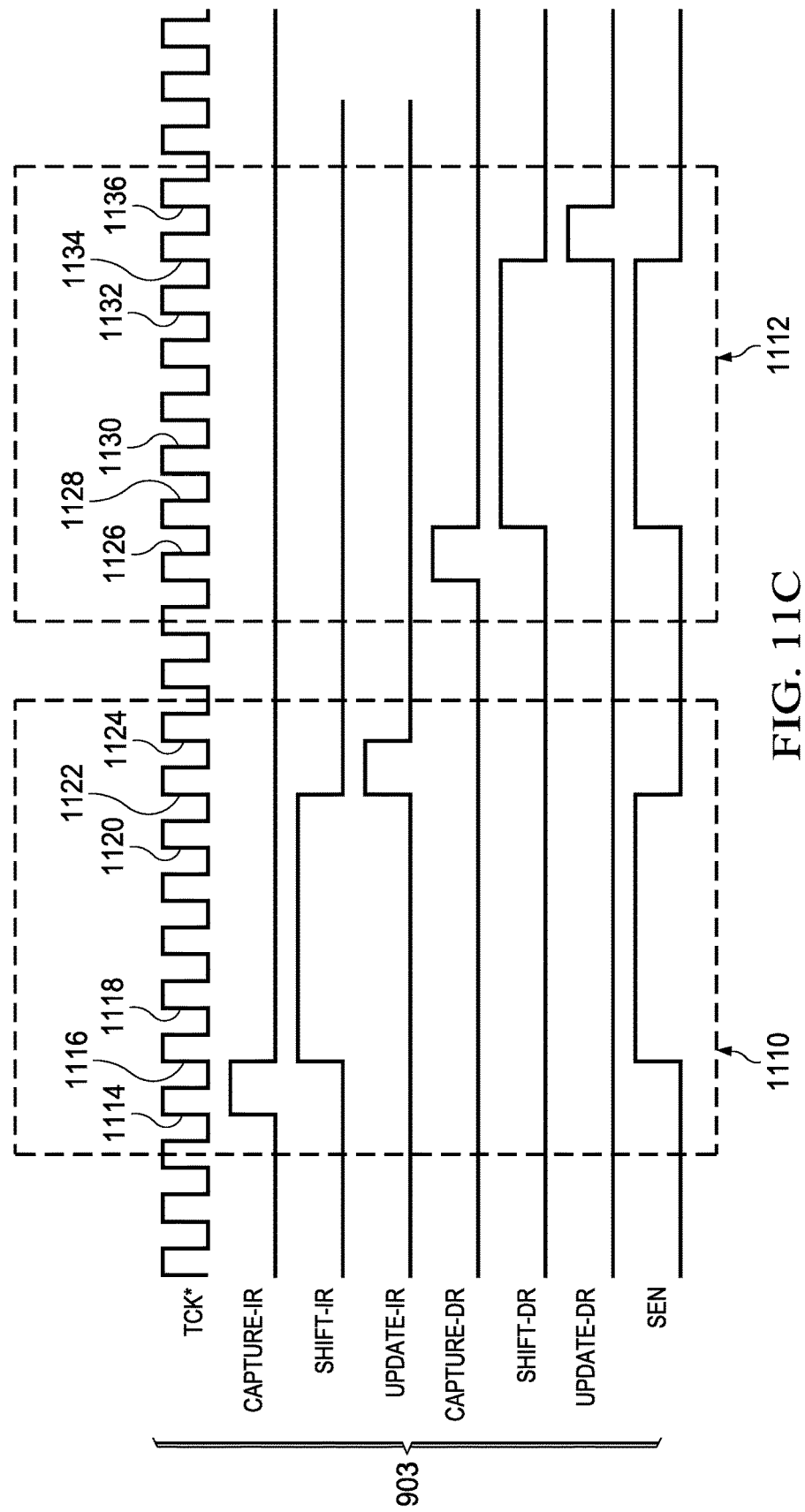
FIG. 11C illustrates a timing diagram depicting an example SAP instruction and data register scan operation.

FIG. 11C shows an example timing diagram of the SSM 902 performing an instruction register 904 access operation 1110 and a data register 906 access operation 1112.

At the beginning of the instruction register access operation 1110, SSM 902 transitions into the Capture-IR state 1016 of FIG. 10 and sets the Capture-IR signal high on rising TCK* edge 1114. On the rising edge of TCK* 1116 parallel input 1101 data is captured into shift register 1102 and SSM 902 transitions into the Shift-IR state 1018 and sets the Shift-IR and SEN signals high. SSM 902 remains in the Shift-IR state 1018 during rising TCK* edges 1118-1120 shifting data into shift register 1102 from TDI and out of shift register 1102 on TDO. On rising edge 1122 the last shift operation occurs and SSM 902 transitions to the Update-IR state 1020 and sets the Update-IR signal high. On rising edge 1124 the data shifted into shift register 1102 is updated (loaded) into update register 1104 to be output as an instruction on the parallel outputs 1107 of update register 1104. SSM 902 transitions to Idle state 1004 on the next rising edge of TCK* to terminate the instruction register access operation 1110.

At the beginning of the data register access operation 1112, SSM 902 transitions into the Capture-DR state 1008 of FIG. 10 and sets the Capture-DR signal high on rising TCK* edge 1126. On the rising edge of TCK* 1128 parallel data 1109 from a circuit within the device is captured into shift register 1106 and SSM 902 transitions into the Shift-DR state 1010 and sets the Shift-DR and SEN signals high. SSM 902 remains in the Shift-DR state 1010 during rising TCK* edges 1130-1132 shifting data into shift register 1106 from TDI and out of shift register 1106 on TDO. On rising edge 1134 the last shift operation occurs and SSM 902 transitions to the Update-DR state 1012 and sets the Update-DR signal high. On rising edge 1136 the data shifted into shift register 1106 is updated (loaded) into update register 1108 to be output on the parallel outputs 1111 of update register 1108 to a circuit within the device. It is important to note that the Update-DR signal and/or other signals, such as but not limited to the TCK, Capture-DR, Shift-DR and/or other signals provided by the SSM 902, may be used to signal a circuit in the device that data is available on the parallel outputs 1111 of update register 1108. Such signals can advantageously act as synchronizing signals between the data outputs 1111 and data inputs 1109 of a data register 106 and the device circuit outputs and inputs that the data register's outputs and inputs are coupled to. Use of such signals provides a simple way to allow the device circuit to know when to output data to the data register inputs 1109 and input data from the data register outputs 1111. SSM 902 transitions to Idle state 1004 on the next rising edge of TCK* to terminate the data register access operation 1112.

Figure 11D:
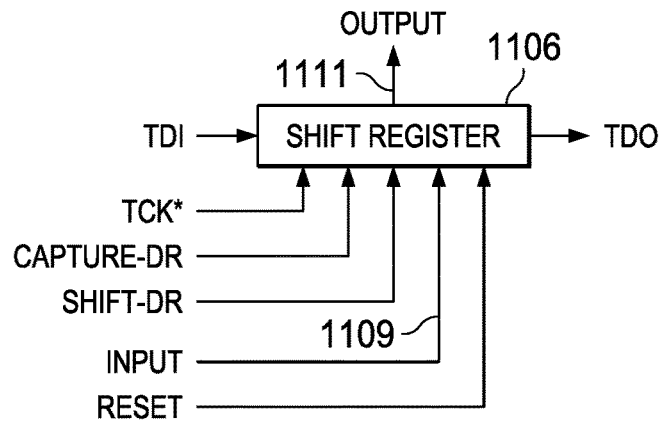
FIG. 11D illustrates a second example implementation of a SAP data register.

FIG. 11D is provided to illustrate a data register 904 design that does not include the Update register. The operation is the same as the data register of FIG. 11B with the exception that the data output of the shift register is the output 1111 that is coupled to a data input of a circuit within the device.

Figure 11E:
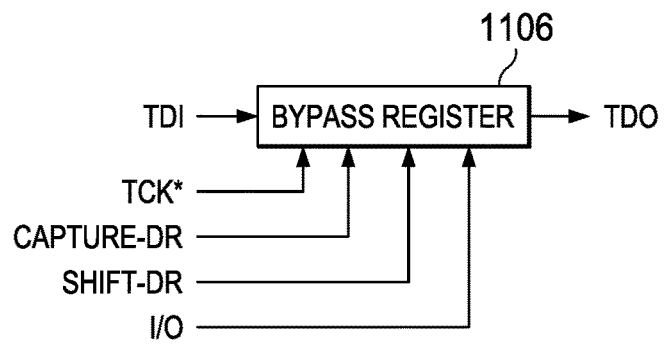
FIG. 11E illustrates a third example implementation of a SAP data register.
Figure 11F:
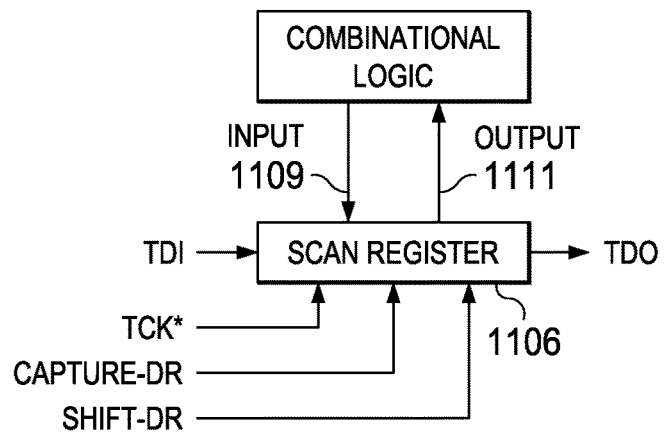
FIG. 11F illustrates a fourth example implementation of a SAP data register.

FIG. 11E is provided to illustrate that the shift register of a data register 904 can serve a single bit bypass register when selected between TDI and TDO. This provides an abbreviated shift path through a device from TDI to TDO. The operation is the same as the data register of FIG. 11B with the exception that the shift register has no data output. During capture operations the bypass register bit loads a logic 1 or 0 bit. During shift operations the bypass register shifts data from TDI to TDO.

FIG. 11E is provided to illustrate that the shift register 1106 of a data register 904 can be a scan register used to test combinational logic within a device by outputting test stimulus to the combinational logic via output bus 1111 and inputting test response from the combinational logic via input bus 1109. The shift elements (i.e. flip flips) of the shift register can be dedicated for test operations or they can be shared between being used for test operations and functional operations. The operation is the same as the data register of FIG. 11B with the exception that the data output of the scan register is input to the combinational logic instead of to an update register.

While the operations of the instruction and data registers of FIGS. 11A, B, D, E and F have been described in the timing diagram of FIG. 11C as being controlled by SSM 902 in a synchronous manner (i.e. free running TCK* design style), the registers could be similarly controlled by an SSM 902 in a non-synchronous manner (i.e. gated TCK* design style), as described in FIGS. 9B and 9C below.

Figure 9B:
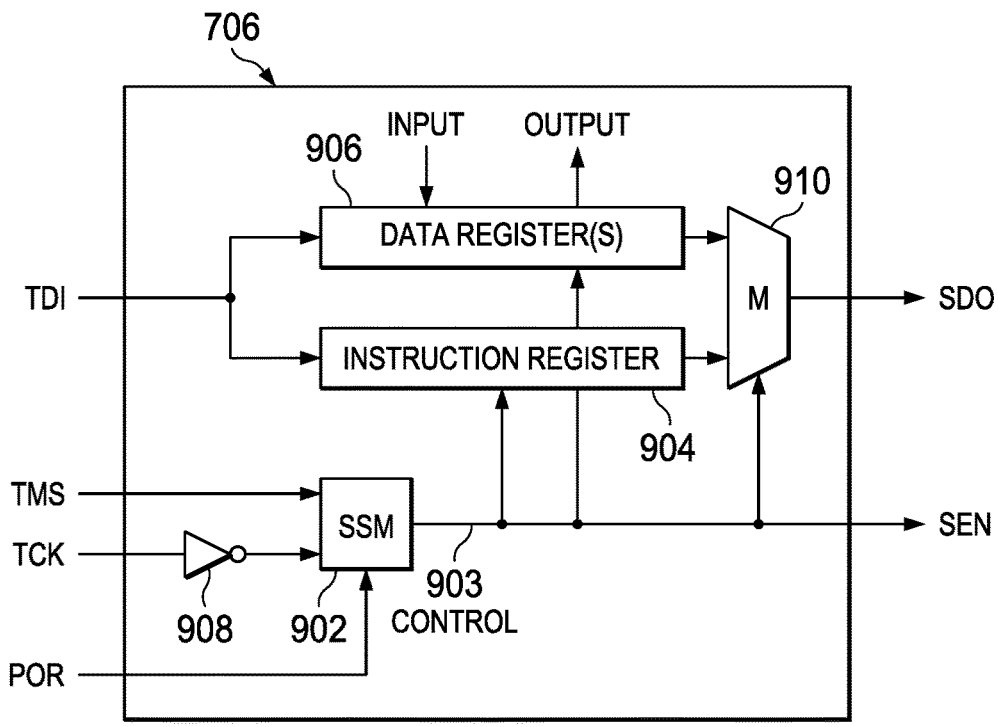
FIG. 9B illustrates a second example implementation of the SAP circuit of FIG. 7.

FIG. 9B illustrates a second example implementation of SAP 706 of FIG. 7. SAP 706 of FIG. 9B is operationally the same as the SAP 706 of FIG. 9A (i.e. operates according to the state diagram of FIG. 10) with the exception that the SSM 902 of FIG. 9B clocks the instruction register 904 using a gated instruction register clock (Clock-IR) and the data register 906 using a gated data register clock (Clock-DR). The Clock-IR signal is output to the instruction register from SSM 902 control bus 903 and replaces the instruction register TCK* signal input shown in FIG. 9A. The Clock-DR signal is output to the data registers from SSM 902 control bus 903 and replaces the data register TCK* signal input shown in FIG. 9A. When gated on, the Clock-IR and Clock-DR signals are driven by the TCK* input to SSM 902.

Figure 9C:
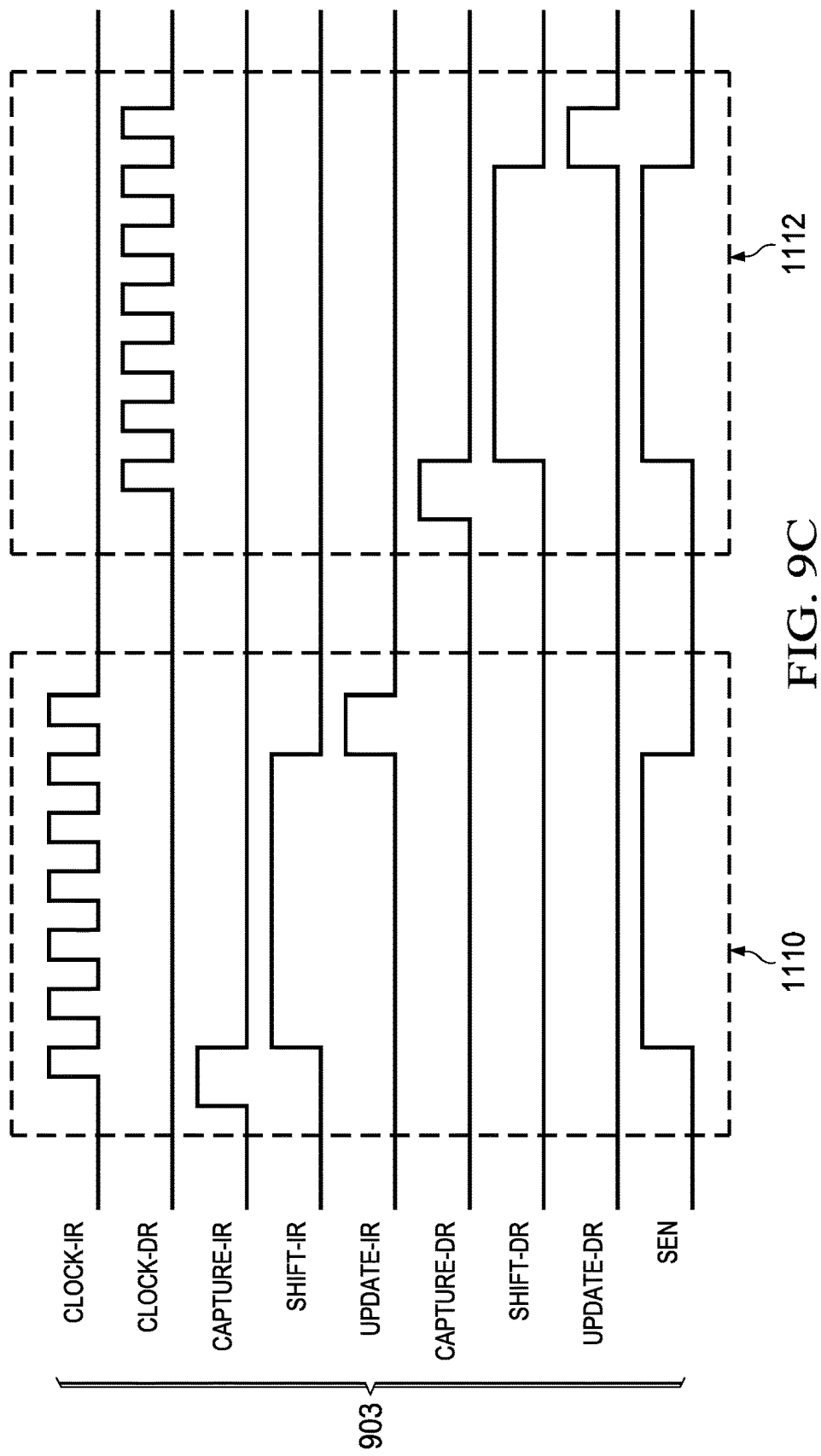
FIG. 9C illustrates a timing diagram depicting an example instruction and data register scan operation using the SAP circuit of FIG. 9B.

FIG. 9C illustrates the timing of the SSM 902 of FIG. 9B performing an instruction register scan operation 1110 and a data register scan operation 1112. The instruction and data register scan operations are the same as described in FIG. 11C with the exception that instruction register 904 is clocked during operation 1110 by the Clock-IR output from SSM 902 and the data register 906 is clocked during operation 1112 by the Clock-DR output from SSM 902.

Figure 12:
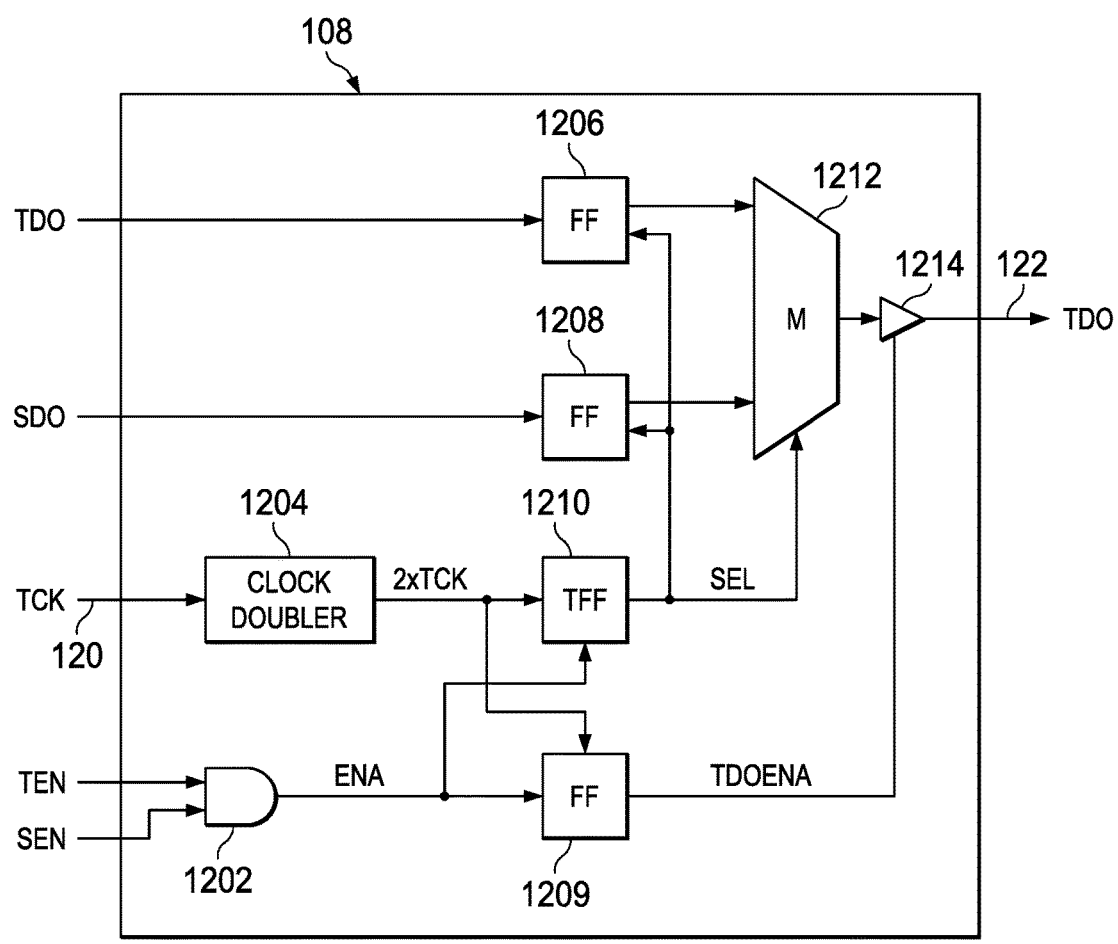
FIG. 12 illustrates an example implementation of a circuit for outputting TDO data from a TAP and/or SAP circuit.

FIG. 12 illustrates an example implementation of TDO output circuit 708 which includes OR gate 1202, clock doubler circuit 1204, flip flops (FF) 1206, 1208 and 1209, toggle flip flop (TFF) 1210, multiplexer 1212, and TDO output buffer 1214, all connected as shown. OR gate 1202 inputs the TEN and SEN enable signals from the TAP 704 and SAP 706 and outputs an enable signal (ENA) to TFF 1210 and FF 1209. Clock doubler 1204 has a clock input for inputting the TCK 120 and a clock output for outputting a clock (2×TCK) to the clock inputs of TFF 1210 and FF 1209 that is 2 times the TCK frequency. TFF 1210 has a clock input for inputting the 2×TCK clock input, a data input for inputting the ENA signal from OR gate 1202, and an output for outputting a select (SEL) signal to the clock inputs of FFs 1206-1208 and selection input of multiplexer 1212. FF 1209 has an data input for inputting the ENA signal from OR gate 1202, a clock input for inputting the 2×TCK from clock doubler 1204, and a data output for outputting a TDO enable (TDOENA) signal to TDO buffer 1214. When enabled by the ENA signal from OR gate 1202, TFF 1210 toggles its SEL output on the rising edge of each 2×TCK input. Multiplexer 1212 has inputs for inputting the data outputs from FFs 1206-1208, a selection input for inputting the SEL signal from TFF 1210, and a data output for outputting data to TDO buffer 1214. TDO buffer 1214 has an input for inputting data from multiplexer 1212, a control input for inputting the TDOENA signal from FF 1209, and a data output for outputting data to TDO 122.

Figure 13:
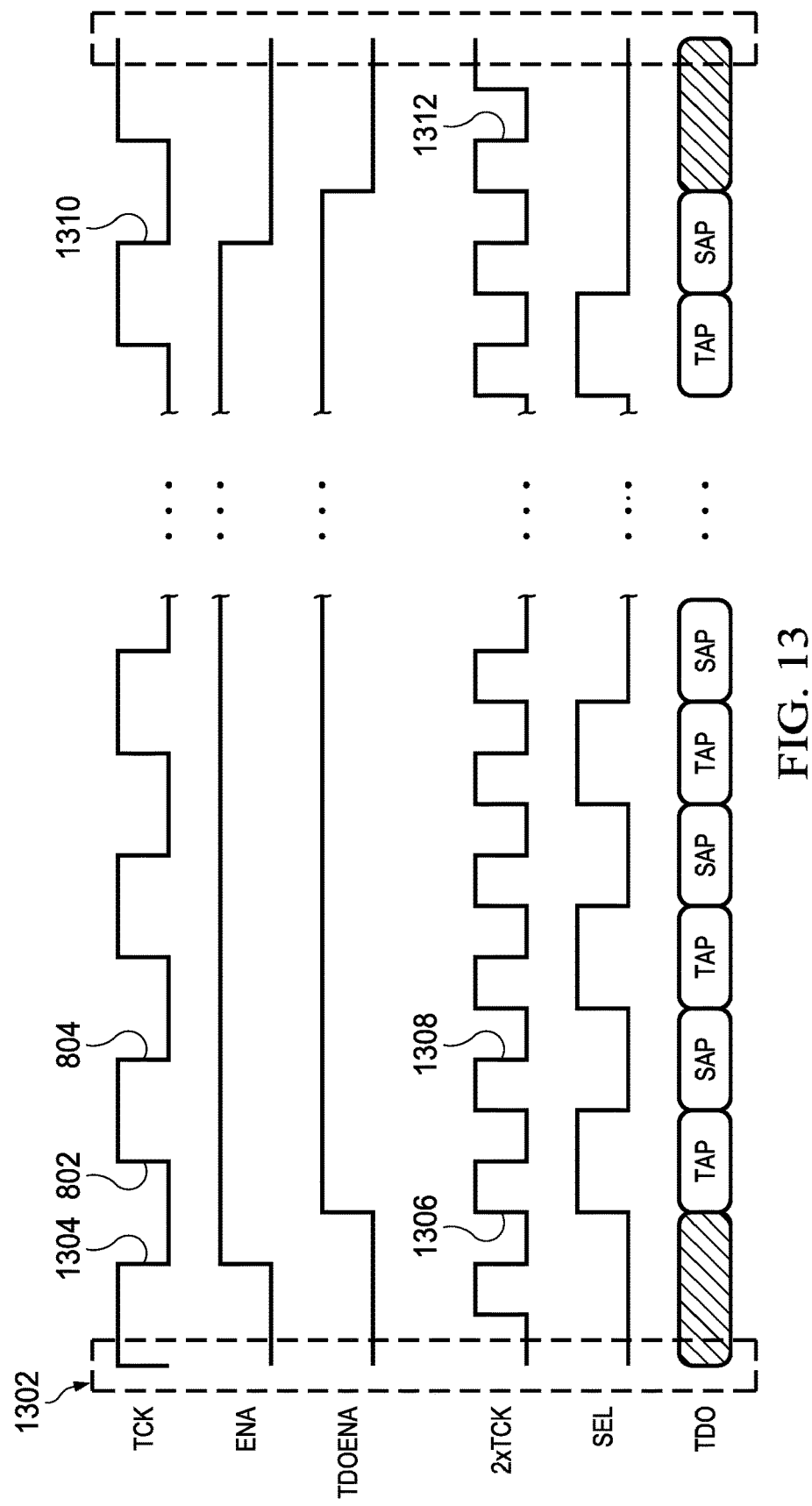
FIG. 13 illustrates a timing diagram of the operation of the TDO output circuit of FIG. 12.

FIG. 13 illustrates a timing diagram of the operation of TDO output circuit 708 of FIG. 12. As seen at time 1302, when the ENA signal from OR gate 1202 is low as a result of both the TEN and SEN signals from TAP 704 and SAP 706 being low, TFF 1210 is reset with the SEL output low and FF 1209 outputs a low on TDOENA to disable TDO buffer 1214. As shown, the clock doubler circuit 1204 remains active while ENA is low to produce 2×TCKs outputs in response to TCK inputs. The output circuit 708 will be disabled by the ENA signal as described above whenever the TAP 704 or SAP 706 is not in one of their shifting states, i.e. Shift-IR or Shift-DR of FIGS. 3 and 10. When the TAP 704 or SAP 706 transition into their shifting states, the ENA signal will go high on the falling edge of TCK at time 1304, as a result of the TEN or SEN signal going high.

On the 2×TCK rising edge 1206, the TDOENA output from FF 1209 is set high to enable the TDO buffer 1214 and the SEL output of TFF 1210 toggles to a high to clock the TDO and SDO data outputs from the TAP and SAP into FFs 1206 and 1208 respectively. The high on SEL also selects the TDO output of FF 1206 to be output on TDO 122 via multiplexer 1212. On the 2×TCK rising edge 1208, the SEL output from TFF 1210 toggles to a low to select the SDO output of FF 1208 to be output on TDO 122. This process of toggling the SEL signal on the rising edges of 2×TCK to latch TDO and SDO data into FFs 1206 and 1208 and to control multiplexer 1212 to alternately output TDO and SDO data from FFs 1206 and 1208 on TMS 122 continues while the TAP and/or SAP are performing a shift operation in states Shift-IR or Shift-DR of FIGS. 3 and 10. Latching the TDO and SDO data into FFs 1206 and 1208 allows the TDO and SDO data to be held in a position so that a controller can reliably sample the TDO data on the rising edges TCK 802 and reliably sample the SDO data on the falling TCK edges 804 as previously described in regard to the timing diagram of FIG. 8. When the TAP and/or SAP exit their Shift-IR or Shift-DR states, the TEN and/or SEN signal will go low, causing the ENA signal to go low on the falling edge of TCK 1310. On the rising edge of 2×TCK at time 1312 the TDOENA output of FF 1209 goes low as a result of ENA being low. The TDO output buffer 1214 is disabled in response to TDOENA going low.

Figure 14:
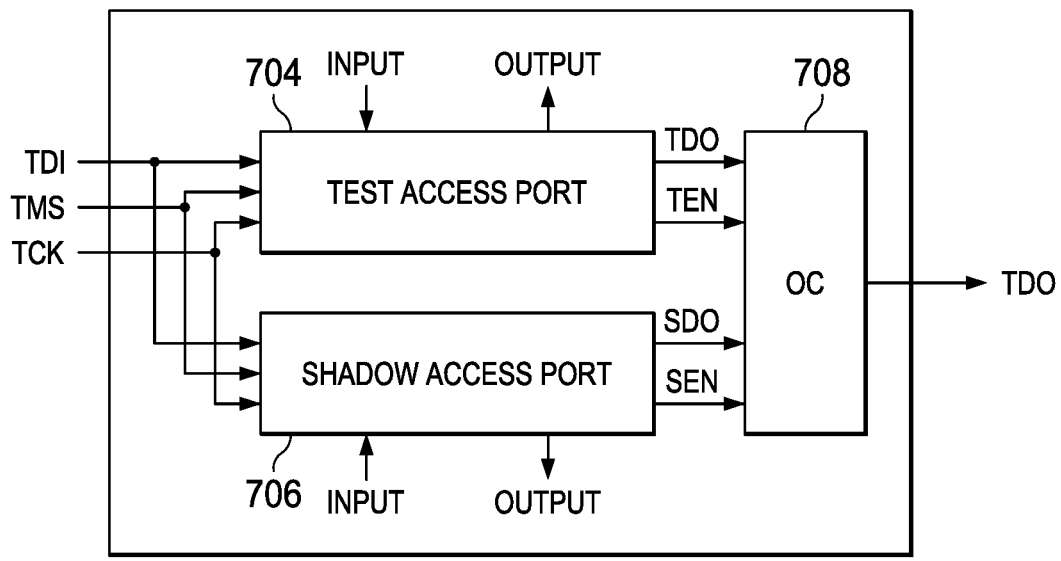
FIG. 14 illustrates a simplified view of a TAP, SAP and output circuit within a device.
Figure 15:
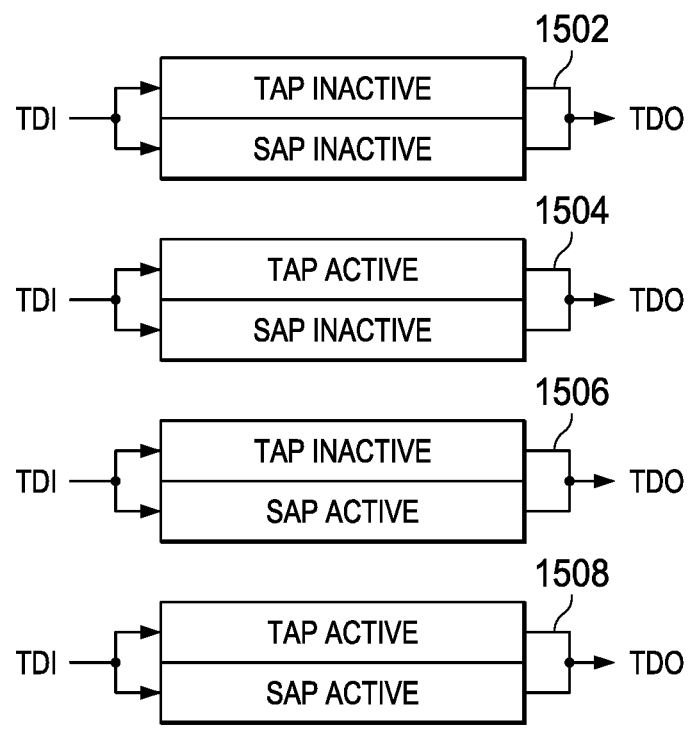
FIG. 15 illustrates the different types of TAP and SAP access states of FIG. 14.

FIG. 14 illustrates a simplified view of a TAP 704, SAP 706 and output circuit 708 in a device for the purpose of describing the different types of states the TAP, SAP and output circuit may be in FIG. 15.

FIG. 15 illustrates the four different states 1502-1508 that the TAP 704, SAP 706, and output circuit 708 of FIG. 14 can be in. In state 1502, both the TAP 704 and SAP 706 are Inactive, i.e. not being accessed to input data on TDI and output data on TDO. In state 1502 the TDO output from output circuit 708 is disabled from outputting data on TDO. In state 1504, the TAP 704 is Active to input data from TDI and output data on TDO while the SAP 706 is Inactive. In state 1504 the TDO output from output circuit 708 is enabled for outputting data from the TAP as described previously in regard to FIGS. 8 and 13. In state 1506, the SAP 706 is Active to input data from TDI and output data on TDO while the TAP 704 is Inactive. In state 1506 the TDO output from output circuit 708 is enabled for outputting data from the SAP as described previously in regard to FIGS. 8 and 13. In state 1508, both the TAP 704 and SAP 706 are Active to input data from TDI and output data on TDO. In state 1508 the TDO output from output circuit 708 is enabled for outputting data from both the TAP and SAP as described previously in regard to FIGS. 8 and 13.

In state 1504 when the TAP is Active and the SAP is Inactive, the TDO output from output circuit 708 outputs data from the TAP to be sampled on the rising edge of each TCK period and data from the SAP to be sampled on the falling edge of each TCK period as described in FIG. 13. In this case, only the data output from the TAP will be meaningful.

In state 1506 when the TAP is Inactive and the SAP is Active, the TDO output from output circuit 708 outputs data from the TAP to be sampled on the rising edge of each TCK period and data from the SAP to be sampled on the falling edge of each TCK period as described in FIG. 13. In this case, only the data output from the SAP will be meaningful.

In state 1508 when both the TAP and SAP are Active, the TDO output from output circuit 708 outputs data from the TAP to be sampled on the rising edge of each TCK period and data from the SAP to be sampled on the falling edge of each TCK period as described in FIG. 13. In this case, both data outputs from the TAP and SAP will be meaningful.

Figure 16:
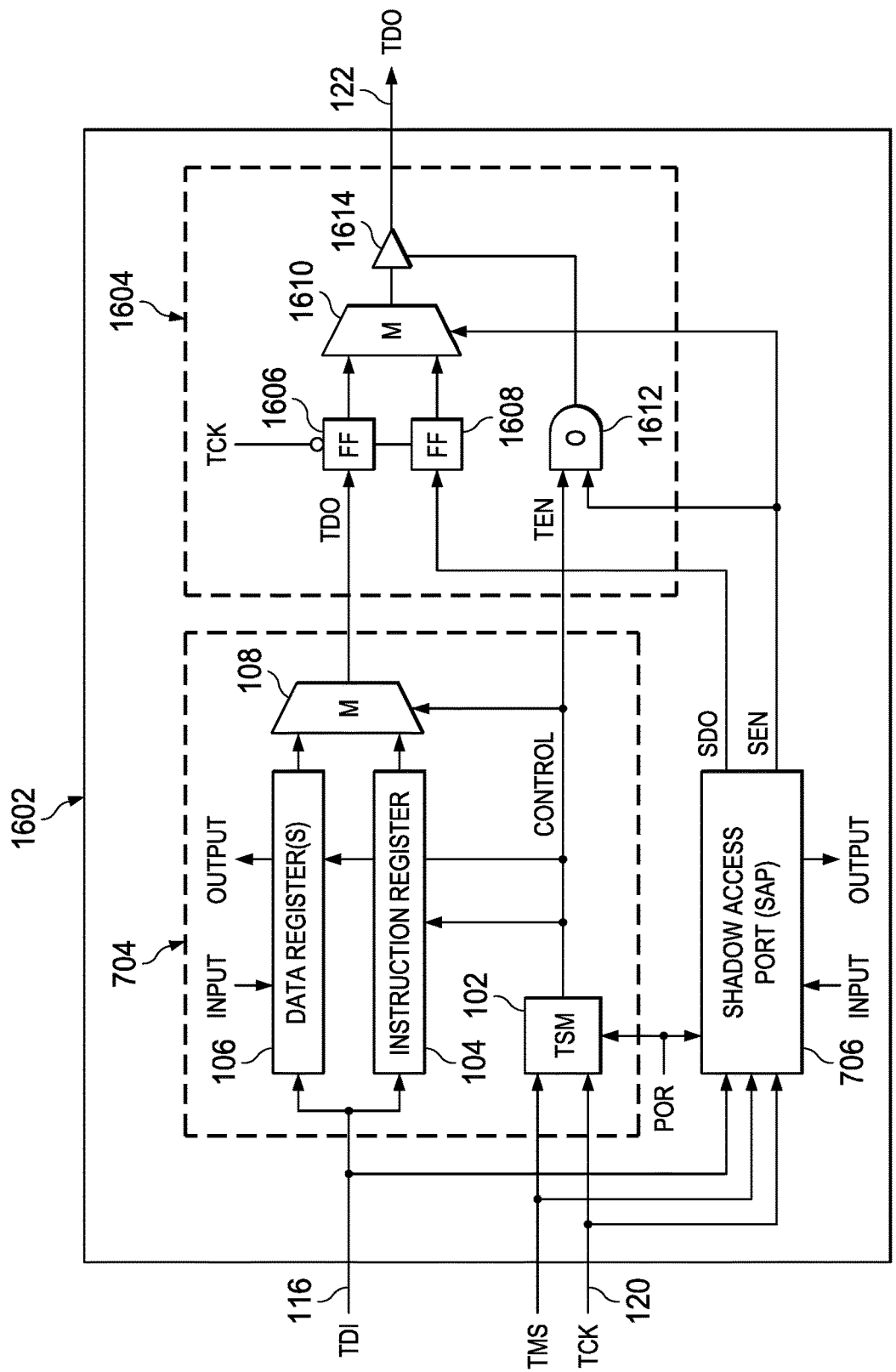
FIG. 16 illustrates the TAP and SAP circuits interfaced to a different type of TDO output circuit.

FIG. 16 illustrates a device 1602 containing a TAP 704 and SAP 706 coupled to a second type of output circuit 1604. The TAP 704 and SAP 706 circuits are the same as previously described. The output circuit 1604 differs from output circuit 708 in that it does not allow both the TAP and SAP to output data on TDO 122 at the same time, as does the output circuit 708. Limiting only the TAP or the SAP to output data on TDO simplifies the design of output circuit 1604 compared to the design of output circuit 708, as seen in the description below.

Output circuit 1604 comprises FFs 1606 and 1608, multiplexer 1610, OR gate 1612, and TDO output buffer 1614 connected as shown. FF 1606 inputs the TDO output from TAP 704 multiplexer 108, an inverted TCK signal, and outputs a registered TDO signal to an input of multiplexer 1610. FF 1608 inputs the SDO output from SAP 706 multiplexer 910, the TCK signal, and outputs a registered SDO signal to an input of multiplexer 1610. Multiplexer 1610 has data inputs for the registered TDO and SDO signals, a control signal coupled to the SEN output of SAP 706, and a data output. Buffer 1614 has a data input coupled to the multiplexer data output, a control input coupled to the output of OR gate 1612, and a data output coupled to TDO 122. The inputs of OR gate 1612 are coupled to the TEN output of TAP 704 and the SEN output of SAP 706.

Figure 2:
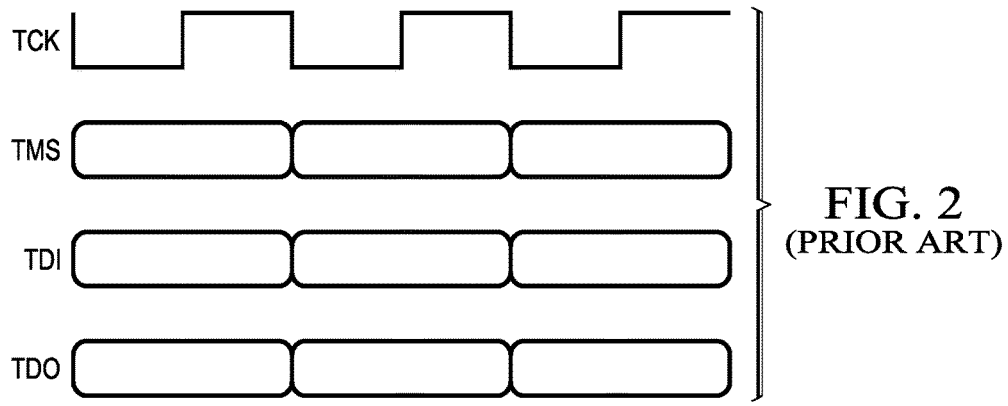
FIG. 2 Illustrates the TCK, TMS, TDI and TDO timing of a conventional 1149.1 TAP.
Figure 17A:
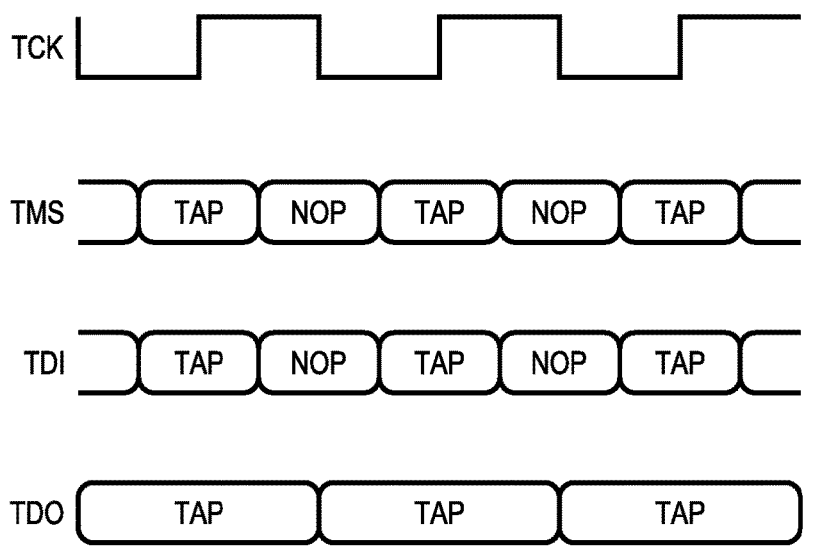
FIG. 17A illustrates the timing of accessing the TAP circuit using the TDO output circuit of FIG. 16.
Figure 17B:
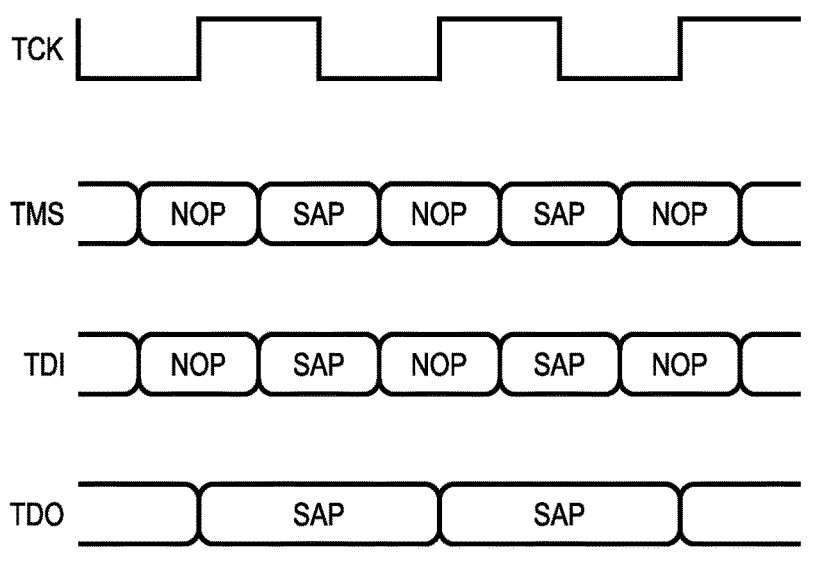
FIG. 17B illustrate the timing of accessing the SAP circuit using the TDO output circuit of FIG. 16.

FIG. 17A illustrates the timing of the device's TDI, TCK, TMS and TDO signals when the TAP 704 is being accessed to input data from TDI 116 and output data on TDO 122 on the rising edge of TCK 120. When the TAP is enabled for access, its TEN output goes high to enable output buffer 1614 via OR gate 1612. During TAP access, the SEN output from SAP 706 is low, causing multiplexer 1610 to couple the registered TDO output from FF 1606 to the TDO output 122. As seen in the timing diagram, the TDO output from TAP 704 is output on TDO 122 on each falling edge of TCK, via FF 1606, to be sampled on the rising edge of TCK. Thus the TAP's TDO output operates as described previously in regard to the conventional TAP 100 of FIG. 1 and illustrated in the timing diagram of FIG. 2. As seen in the timing diagram, when the TAP is being accessed the TMS and TDI inputs to the SAP, during the falling edges of TCK, will be signals that keep the SAP in an Inactive state, i.e. no-operation (NOP) state. FIG. 17B illustrates the timing of the device's TDI, TCK, TMS and TDO signals when the SAP 706 is being accessed to input data from TDI 116 and output data on TDO 122 on the falling edge of TCK 120. When the SAP is enabled for access, its SEN output goes high to enable output buffer 1614 via OR gate 1612. During SAP access, the SEN output from SAP 706 is high, causing multiplexer 1610 to couple the registered SDO output from FF 1608 to the TDO output 122. As seen in the timing diagram, the SDO output from SAP 706 is output on TDO 122 on each rising edge of TCK, via FF 1608, to be sampled on the falling edge of TCK. Thus the SAP's SDO output operates as described previously in regard timing diagrams of FIGS. 3 and 10 with the exception that the SDO data is output on TDO 122 from rising edge to rising edge of TCK 120. As seen in the timing diagram, when the SAP is being accessed the TMS and TDI inputs to the TAP, during the rising edges of TCK, will be signals that keep the TAP in an Inactive state, i.e. no-operation (NOP) state.

The use of the simpler output circuit 1604 of FIG. 16 may be preferred over the output circuit 708 of FIG. 7 if it is determined that the TAP and SAP of a device will always be accessed individually as shown previously in access states 1504 and 1506 of FIG. 15 and not simultaneously as in access state 1508 of FIG. 15.

Figure 18:
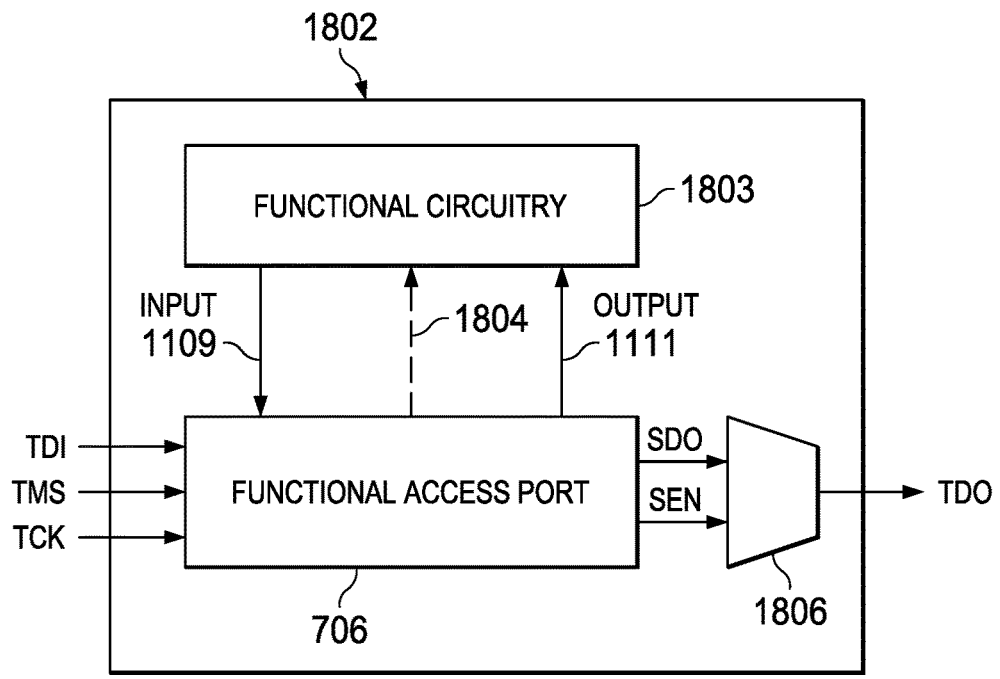
FIG. 18 illustrate the SAP circuit being used to access functional circuitry within a device.

FIG. 18 is provided to illustrate that the SAP 706 may be an access port for accessing functional circuitry 1803 in a device 1802. For simplification, FIGS. 18-23 only show the SAP 706 circuit coupled to a circuit for performing input and output operations. The functional circuitry may be any type of circuit including a DSP, CPU, memory, Codec, A/D, D/A, general input/output peripheral and/or a mixed signal circuit. As seen the SAP 706 inputs data from the functional circuitry via a data input bus 1109 of FIG. 11B and/or outputs data to the functional circuitry via a data output bus 1111 of FIG. 11B. The SAP can provide control signals 1804, such at the TCK, Capture-DR, Shift-DR, and Update-DR signals mentioned in regard to FIG. 11C, to control the input of data to the functional circuitry and/or the output of data from the functional circuitry. The output circuit 1806 of FIG. 18 may be either output circuit 708 of FIG. 7 or output circuit 1604 of FIG. 16.

Figure 19:
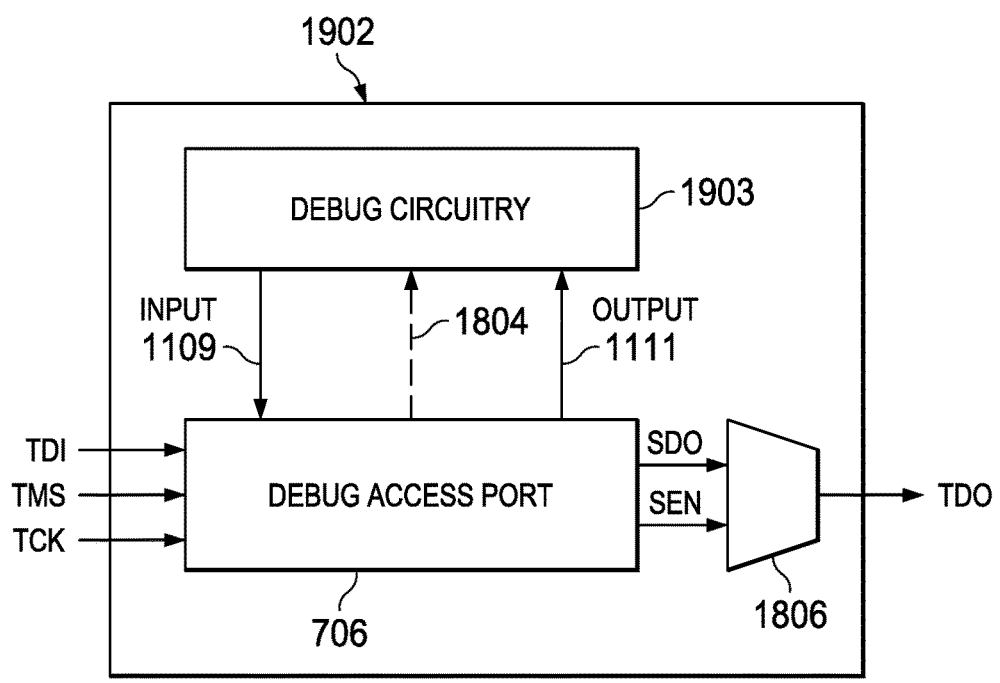
FIG. 19 illustrates the SAP circuit being used to access debug circuitry within a device.

FIG. 19 is provided to illustrate that the SAP 706 may be an access port for accessing debug circuitry 1903 in a device 1902. The debug circuitry may be any type of circuit used for debugging the functional operation of a circuit within the device. As seen the SAP 706 inputs data from the debug circuitry via a data input bus 1109 of FIG. 11B and/or outputs data to the debug circuitry via a data output bus 1111 of FIG. 11B. The SAP can provide control signals 1804, such at the TCK, Capture-DR, Shift-DR, and Update-DR signals mentioned in regard to FIG. 11C, to control the input of data to the debug circuitry and/or the output of data from the debug circuitry. The output circuit 1806 of FIG. 19 may be either output circuit 708 of FIG. 7 or output circuit 1604 of FIG. 16.

Figure 20:
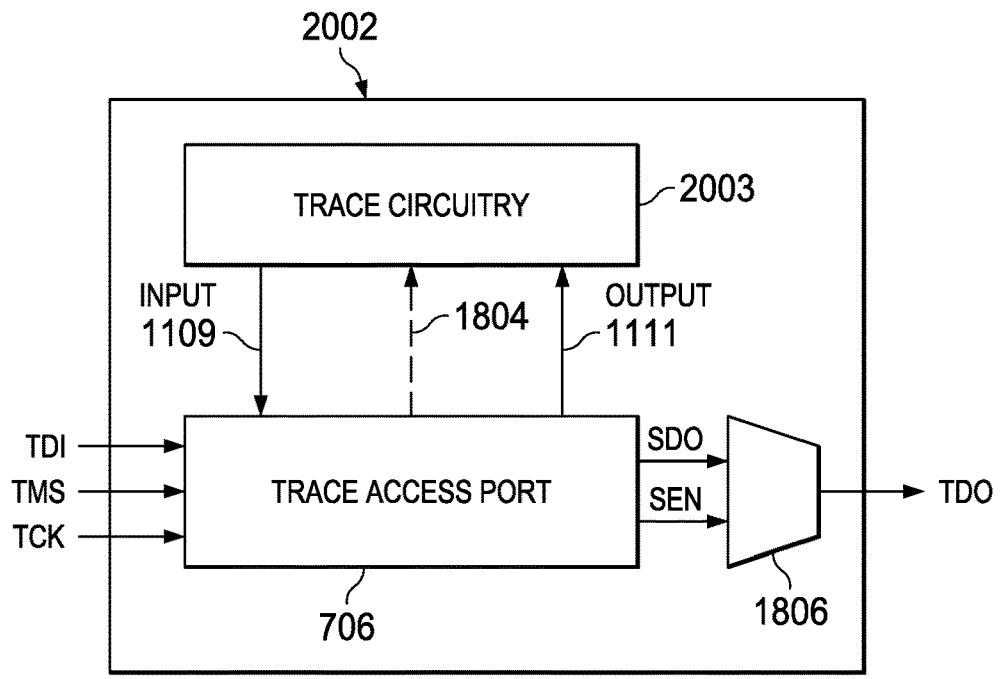
FIG. 20 illustrates the SAP circuit being used to access trace circuitry within a device.

FIG. 20 is provided to illustrate that the SAP 706 may be an access port for accessing trace circuitry 2003 in a device 2002. The trace circuitry may be any type of circuit used for tracing the functional operation signals of a circuit within the device. As seen the SAP 706 inputs data from the trace circuitry via a data input bus 1109 of FIG. 11B and/or outputs data to the trace circuitry via a data output bus 1111 of FIG. 11B. The SAP can provide control signals 1804, such at the TCK, Capture-DR, Shift-DR, and Update-DR signals mentioned in regard to FIG. 11C, to control the input of data to the trace circuitry and/or the output of data from the trace circuitry. The output circuit 1806 of FIG. 19 may be either output circuit 708 of FIG. 7 or output circuit 1604 of FIG. 16.

Figure 21:
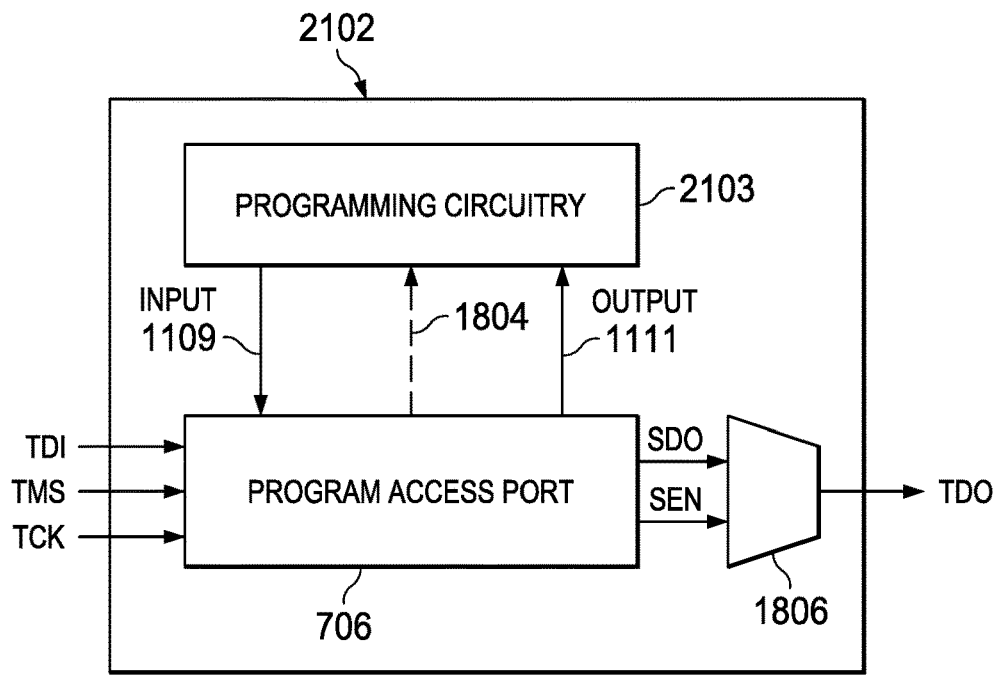
FIG. 21 illustrates the SAP circuit being used to access programming circuitry within a device.

FIG. 21 is provided to illustrate that the SAP 706 may be an access port for accessing programming circuitry 2103 in a device 2102. The programming circuitry may be any type of circuit used for programming a circuit within a device. As seen the SAP 706 inputs data from the programming circuitry via a data input bus 1109 of FIG. 11B and/or outputs data to the programming circuitry via a data output bus 1111 of FIG. 11B. The SAP can provide control signals 1804, such at the TCK, Capture-DR, Shift-DR, and Update-DR signals mentioned in regard to FIG. 11C, to control the input of data to the programming circuitry and/or the output of data from the programming circuitry. The output circuit 1806 of FIG. 19 may be either output circuit 708 of FIG. 7 or output circuit 1604 of FIG. 16.

Figure 22:
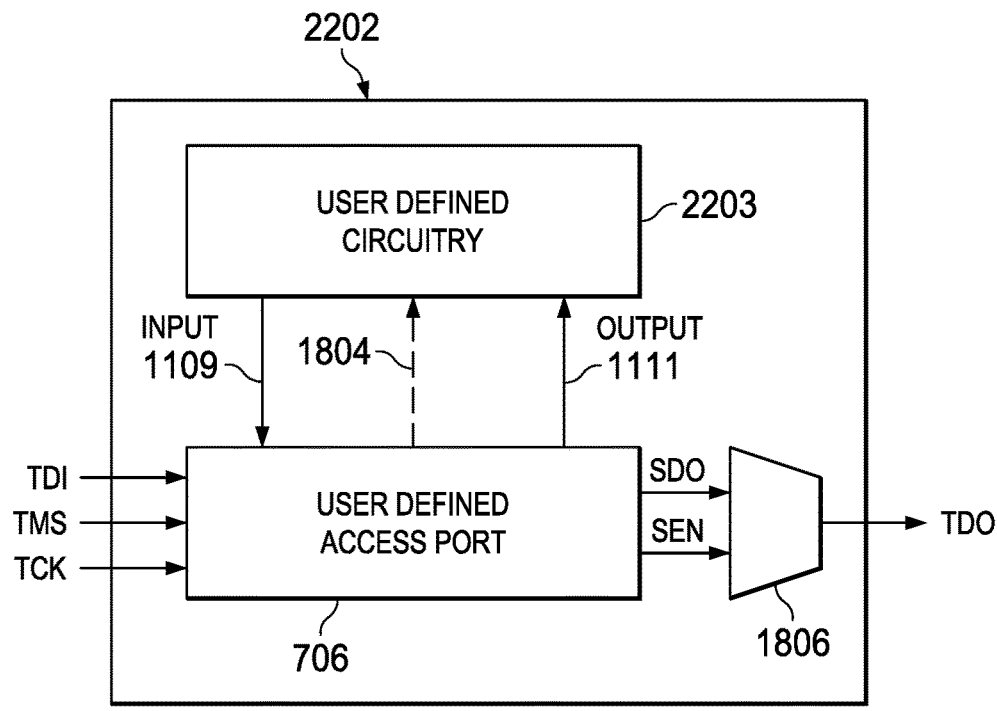
FIG. 22 illustrates the SAP circuit being used to access user defined circuitry within a device.

FIG. 22 is provided to illustrate that the SAP 706 may be an access port for accessing user defined circuitry 2203 in a device 2202. The user defined circuitry may be any type of circuit the user defines for use within a device. As seen the SAP 706 inputs data from the user defined circuitry via a data input bus 1109 of FIG. 11B and/or outputs data to the user defined circuitry via a data output bus 1111 of FIG. 11B. The SAP can provide control signals 1804, such at the TCK, Capture-DR, Shift-DR, and Update-DR signals mentioned in regard to FIG. 11C, to control the input of data to the user defined circuitry and/or the output of data from the user defined circuitry. The output circuit 1806 of FIG. 19 may be either output circuit 708 of FIG. 7 or output circuit 1604 of FIG. 16.

It should be understood that some or all of the functional circuitry 1803, debug circuitry 1903, trace circuitry 2003 programming circuitry 2103, and user defined circuitry 2203 of FIGS. 18-22 could be included in the same device and accessed by a single SAP 706 within the device. If accessed by a single SAP, each included circuit 1803, 1903, 2003, 2103 and 2203 would be coupled to a separate data input 1109 and data output 1111 bus of a data register 106. The SAP's instruction register 104 would be loaded with an instruction that selects which circuit 1803-2203 is to be accessed by selecting a data register associated with the circuit to be accessed.

Figure 23:
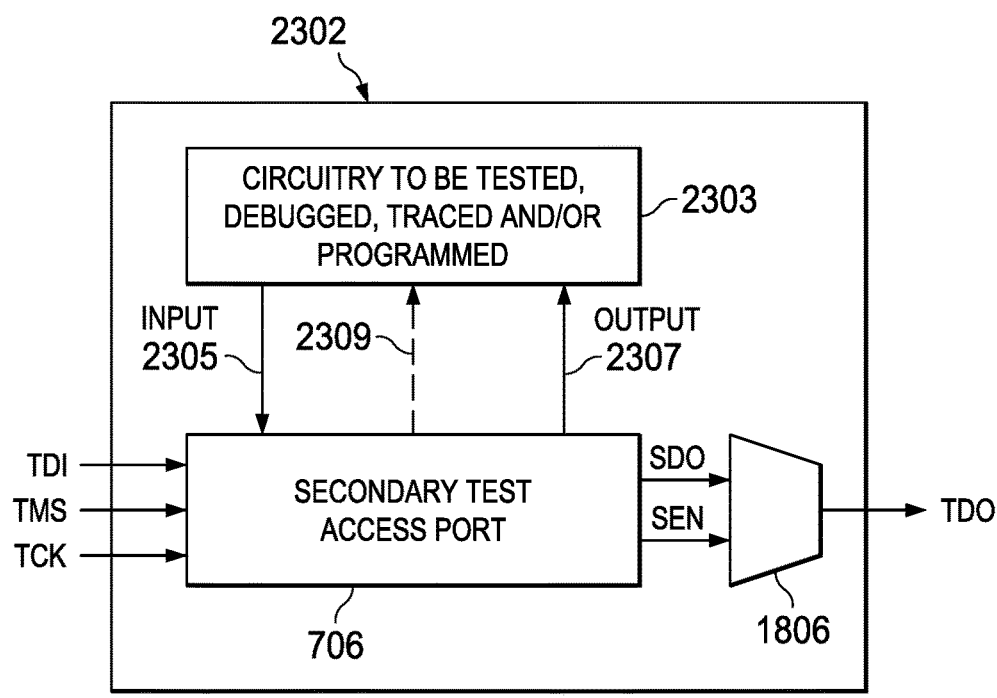
FIG. 23 illustrates a SAP circuit within a device being used as a secondary TAP circuit within the device to access test, debug, trace and/or programming circuitry.

FIG. 23 is provided to illustrate that the SAP 706 may be designed to operate as a secondary TAP 704 for accessing circuitry to be tested, debugged, traced and/or programmed within a device 2302. As seen the SAP 706 inputs data from the test, debug, trace and/or programming circuitry via a data register 106 input bus 2305 and/or outputs data to the test, debug, trace and/or programming circuitry via a data register 106 output bus 2307. The SAP can provide control signals 2309, such as the ones previously mentioned in regard to FIG. 11C, from the TSM 102 control output 103 of FIG. 1 to control the output of data to the circuitry 2303 and/or the input of data from the circuitry 2303. The output circuit 1806 of FIG. 19 may be either output circuit 708 of FIG. 7 or output circuit 1604 of FIG. 16.

Figure 24:
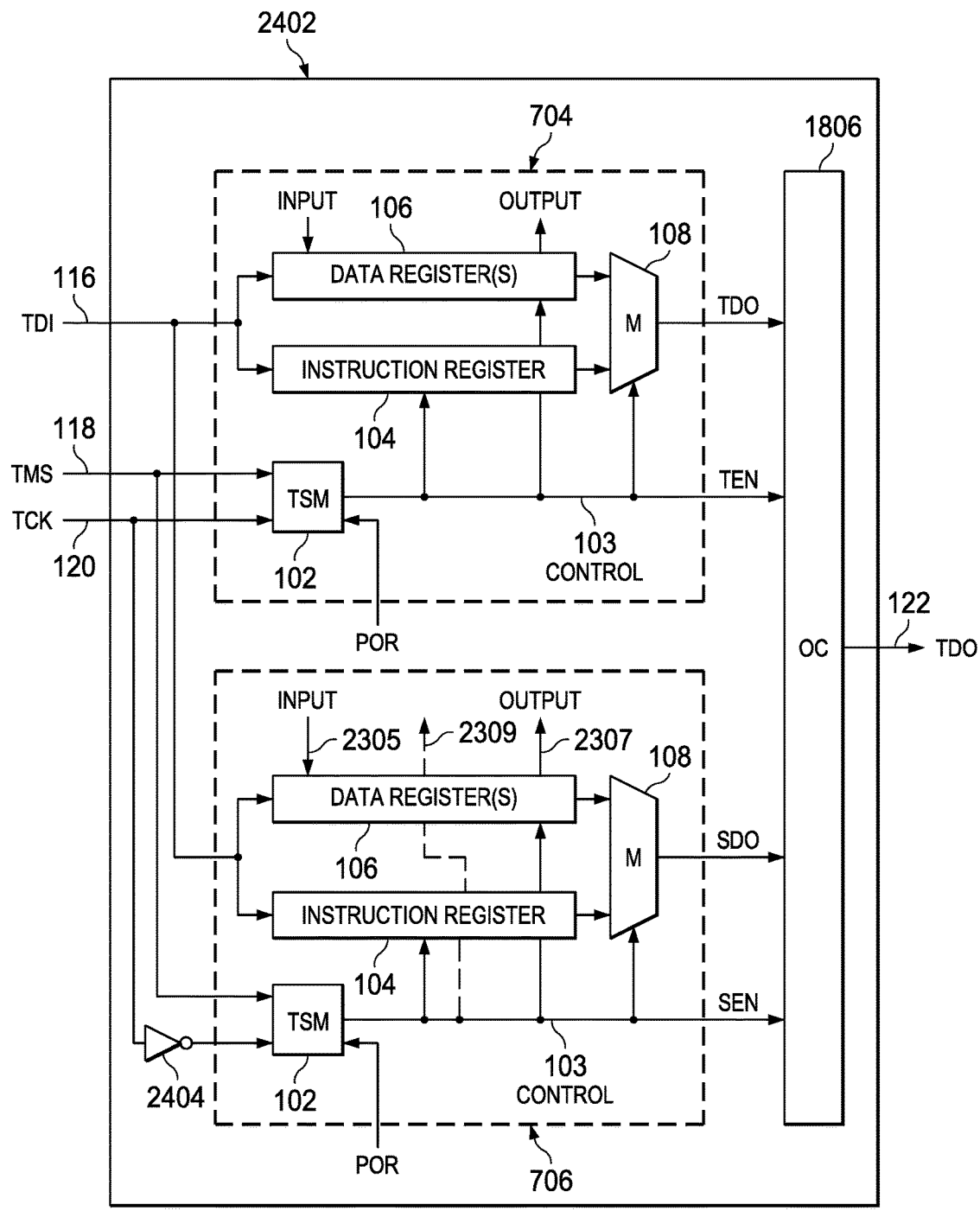
FIG. 24 illustrates a TAP and SAP circuit in a device wherein the SAP circuit is designed to operate as a secondary TAP circuit in the device.

FIG. 24 illustrates a device 2402 comprising a TAP 704 and a SAP 706 designed to operate as a TAP 704. SAP 706 could be the SAP 706 of FIG. 23. The TAP 704 is coupled to TDI, TMS, and TCK and the SAP 706 is coupled to TDI, TMS and TCK. As seen, the TCK input to the SAP 706 passes through an inverter 2404 to allow the SAP 706 to operate on the falling edge of TCK as previously described. The TAP 704 is coupled to output circuit 1806 via TDO and TEN, and the SAP 706 is coupled to output circuit 1806 via SDO and SEN, as previously described. The output circuit 1806 could be output circuit 708 FIGS. 7 and 12 or output circuit 1604 of FIG. 16. Both the TAP and SAP operate according to the state diagram of FIG. 3. During TAP 704 instruction or data shift operations, data is shifted into the TAP 704 from TDI 116 and data from the TAP 704 is shifted out to TDO 122 via output circuit 1806. During SAP 706 instruction or data shift operations, data is shifted into the SAP 706 from TDI 116 and data from the SAP 706 is shifted out to TDO 122 via output circuit 1806.

The data registers 106 of the TAP 704 are similar to the data registers described for the SAP 706 in FIGS. 11A-11F. Data shifted into a data register of SAP 706 from TDI can be output to circuitry to be tested, debugged, traced and/or programmed, as shown in FIG. 23, via a data output bus 2307. Likewise, data input to a data register 106 of SAP 706, via input bus 2305, from circuitry to be tested, debugged, traced and/or programmed can be shifted out on TDO. As mentioned in regard to FIG. 23, control signals 2309 from the SAP's TSM 102 control bus 103 can be output to test, debug, trace and/or programming circuitry to control when the test, debug, trace and/or programming circuitry inputs and outputs data to the SAP 706 via input and output busses 2305 and 2307.

Figure 25:
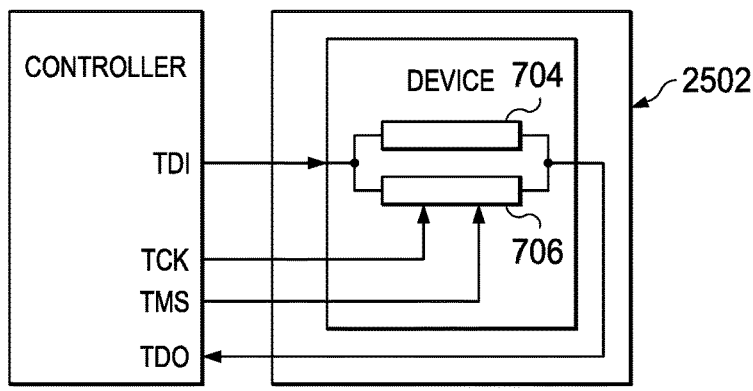
FIG. 25 illustrates a connection between a controller and one device containing a TAP and SAP circuit according to the disclosure.
Figure 26:
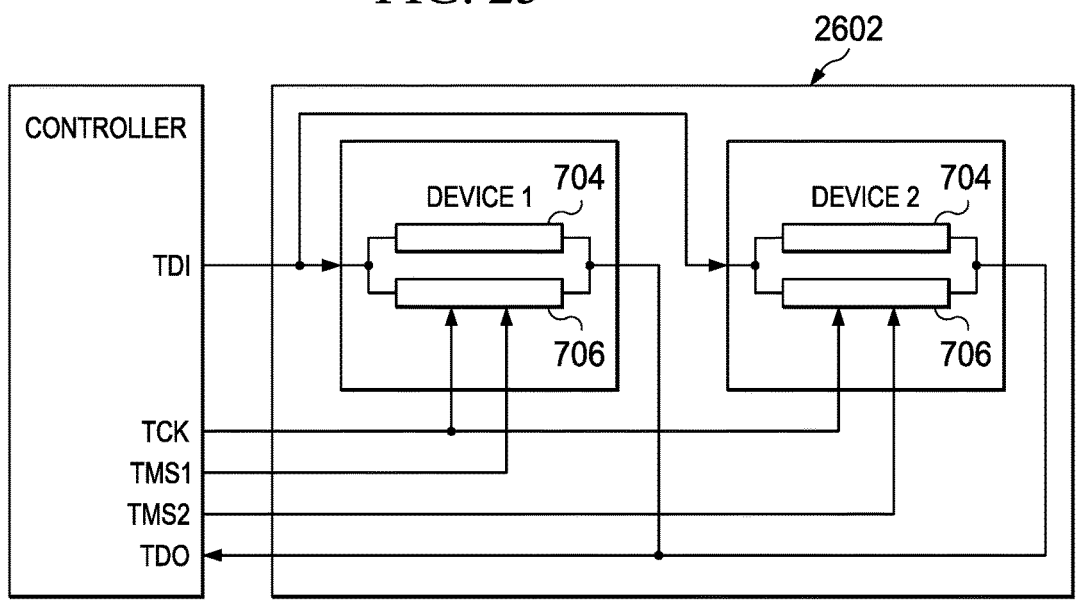
FIG. 26 illustrates a connection between a controller and a parallel arrangement of devices, each device containing a TAP and SAP circuit according to the disclosure.
Figure 27:
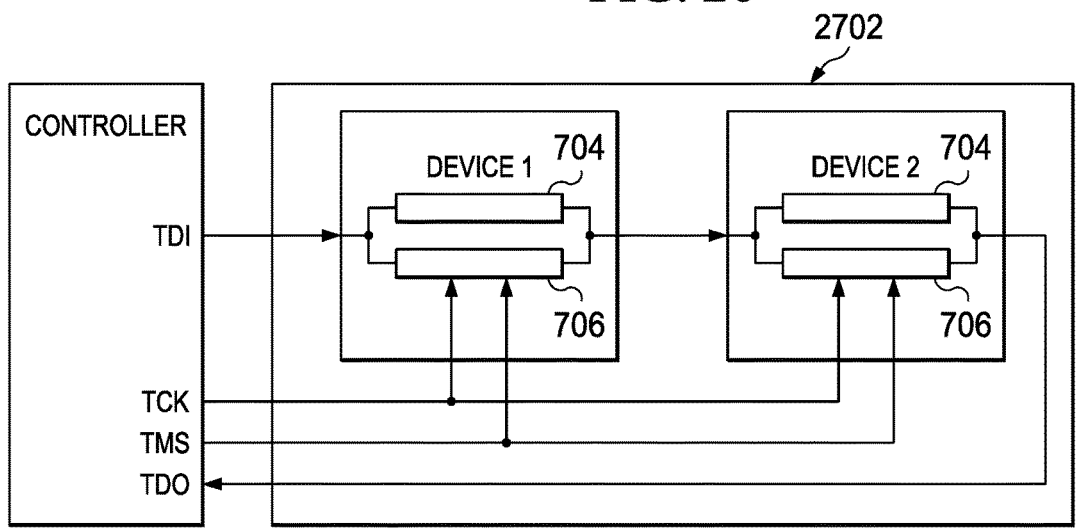
FIG. 27 illustrates a connection between a controller and a serial arrangement of devices, each device containing a TAP and SAP circuit according to the disclosure.

FIGS. 25-26 are provided to illustrate electronic systems 2502, 2602, 2702, containing devices, each device containing a TAP 704, a SAP 706, and an output circuit 1806 according to the disclosure. For simplification, the output circuit 1806 is not shown. The electronic systems could be a board or other substrate with IC devices, an IC with embedded core devices, or a core with further embedded core devices. As seen in FIG. 25-27, a JTAG TAP controller may be coupled to the TAP 704 and SAP 706 terminals of a single device (FIG. 25), to the TAP 704 and SAP 706 terminals of a group of parallel arranged devices (FIG. 26), or to the TAP 704 and SAP 706 terminals of a group of serially arranged devices (FIG. 27). The TAP 704 and/or SAP 706 of the devices may be accessed by the JTAG controller as previously described. In FIG. 25, the TAP and/or SAP of a single device may be accessed by the JTAG controller. In FIG. 26, the TAP and/or SAP of a selected one of the devices may be accessed by the JTAG controller. In FIG. 27, the TAPs and/or SAPs of all the serially connected devices may be accessed by the JTAG controller.

In FIG. 27, the state machines 902 of the device SAPs 706 need to operate the same, i.e. each state machine 902 operates according to the same state diagram, such as the state diagram of FIG. 10. Having state machines 902 that operate using the same state diagram allows the serially arranged SAPs of FIG. 27 to perform the same operations in response to the TCK and TMS input signals, i.e. capture operation, shift operation, update operation, reset operation and idle operation.

It should be understood that the device SAPs 706 of FIGS. 25 and 26 can have different types of state machines 902 since only one device SAP 706 is ever accessed at a time. However, to simplify standardized use of SAP circuits within devices it is advantageous to make the state machines 902 of all SAP circuits 706 operate according to a standardized state diagram, again such as the state diagram of FIG. 10.

While the concept of using a shadow access port in a device has been described as it would be used in conjunction with a test access port within the device, it is not limited to use with only a test access port. Indeed, the shadow access port concept can be used in conjunction with any type of access port in a device to provide additional capabilities within the device. The following describes an example of using a shadow access port with a functional access port within a device.

Figure 28:
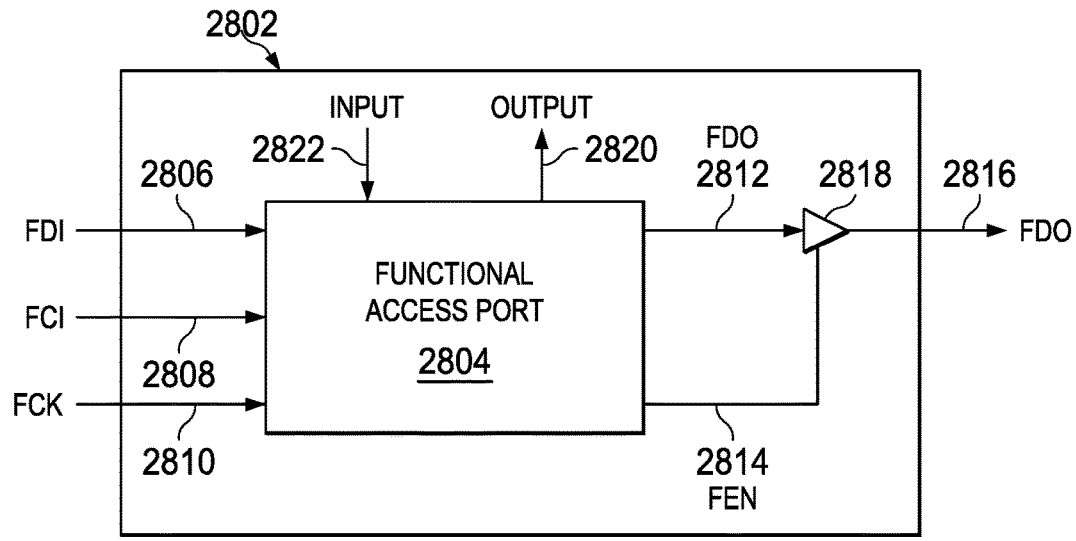
FIG. 28 illustrates a device with a functional access port (FAP).

FIG. 28 illustrates a device 2802 having an example functional access port (FAP) 2804. The FAP 2804 has a functional data input (FDI) 2806, a functional control input (FCI) 2808, a functional clock input (FCK) 2810, a functional data output (FDO) 2812, and a function enable output (FEN) 2814. The FDO 2812 is input to a buffer 2818 which outputs a FDO signal 2816. The FEN 2814 serves to enable buffer 2818 to output FDO 2812 to FDO 2816 and disable buffer 2818 from outputting FDO 2812 to FDO 2816. The FAP 2804 responds to the FCI 2808 and FCK 2810 signals to input data from FDI 2806 and output data on FDO 2816 via buffer 2818. The data input from FDI is output to another circuit via FAP output bus 2820 and the data output on FDO is input from another circuit via FAP input bus 2822. In this example, the FAP is assumed to operate on the rising edge of the FCK input, as did the TAP 704, during its operation.

Figure 29:
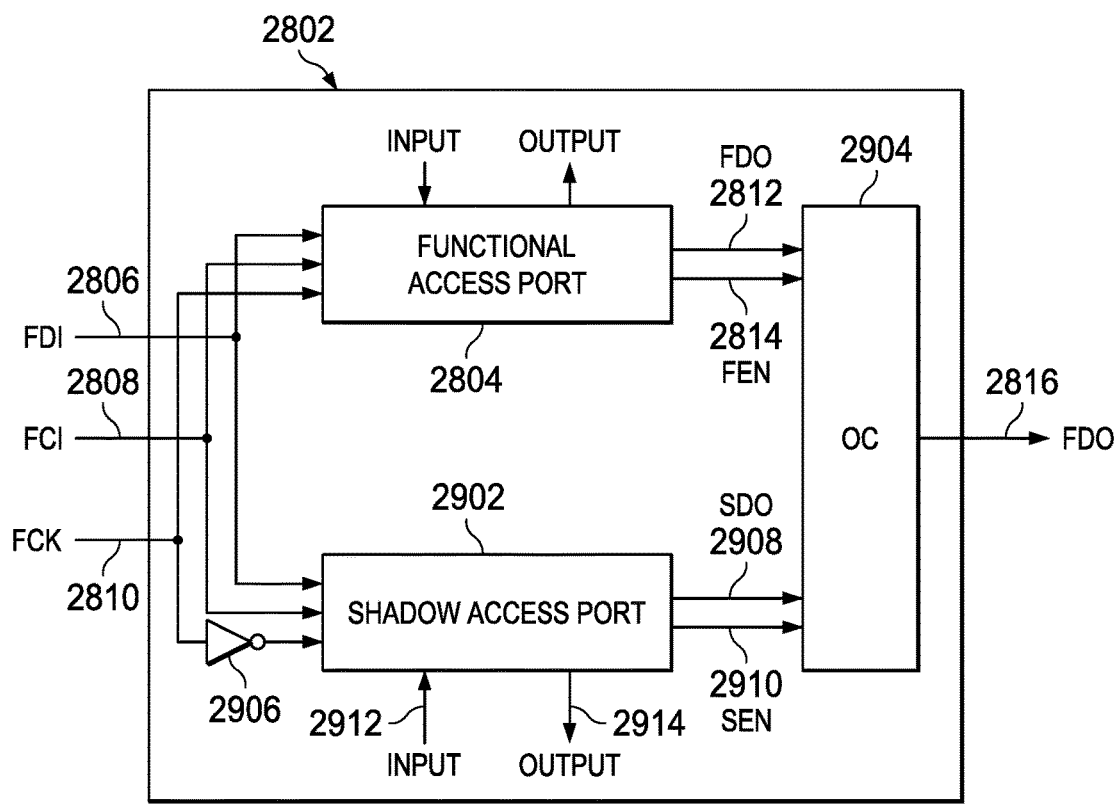
FIG. 29 illustrates a shadow access port (SAP) being added to the functional access port of the device in FIG. 28.

FIG. 29 illustrates the device 2802 of FIG. 28 being modified to include a shadow access port (SAP) 2902 for the purpose of providing additional capabilities in device 2802 by reusing the existing FDI, FCI, FCK and FDO device signals. As seen, the modification includes adding a SAP 2902, an inverter 2906, and an output circuit 2904. The SAP 2902 has an input coupled to FDI 2806, an input coupled to FCI 2808, an input coupled to FCK 2810 via inverter 2906, a shadow data output (SDO) 2908, and a shadow enable (SEN) output. The output circuit 2904 is substituted for buffer 2818 of FIG. 28. The output circuit 2904 inputs the FDO 2812 and FEN 2814 output signals from FAP 2804 and the SDO 2908 and SEN 2910 output signals from SAP 2902, and outputs the FDO signal 2816.

The FAP 2804 of FIG. 29 responds to FCI 2808 on the rising edge of FCK 2810 to input data from FDI 2806 and output data on FDO 2816 via output circuit 2904 as previously described. The output circuit 2904 is enabled to output data from FDO 2812 to FDO 2816 by the FAP's FEN signal 2814.

The SAP 2902 of FIG. 29 responds to FCI 2808 on the falling edge of FCK 2810 (due to inverter 2906) to input data from FDI 2806 and output data on FDO 2816 via output circuit 2904. The data input to the SAP from FDI is output to another circuit via SAP output bus 2914 and the data output on FDO 2816 is input to the SAP from another circuit via SAP input bus 2912. The output circuit 2904 is enabled to output data from SDO 2908 to FDO 2816 by the SAP's SEN signal 2910.

The output circuit 2904 may be output circuit 708, output circuit 1604, or another type of output circuit that can selectively output data from FAP 2804 and/or SAP 2902 to FDO 2816.

While the FIG. 29 example described the FAP 2804 as operating on the rising edge of FCK and the SAP 2902 as operating on the falling edge of FCK this need not be the case. Indeed the FAP could operate on the falling edge of FCK and the SAP could operate on the rising edge of FCK if desired.

As previously described in using a SAP with a TAP, the use of a SAP with the FAP of FIG. 29 does not interfere with the normal operation of the FAP. The SAP simply reuses the FAP interface signals FDI, FCI, FCK and FDO in a transparent manner to provide the additional capabilities desired within the device of FIG. 29.

Figure 30:
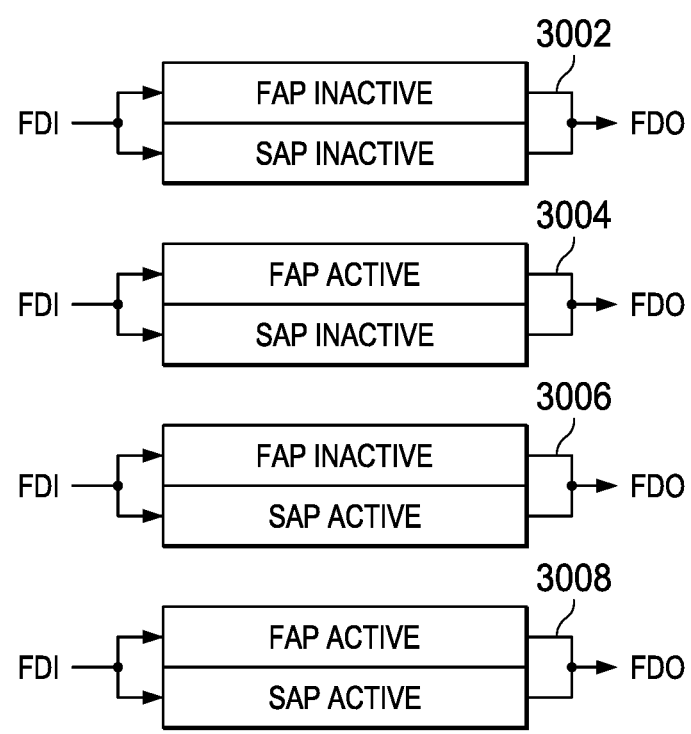
FIG. 30 illustrate access states to the FAP and SAP of FIG. 29.

FIG. 30 is provided to illustrate examples of four different states 3002-3008 that the FAP 2804, SAP 2902 and output circuit 2904 of FIG. 29 may be in. In state 3002, both the FAP 2804 and SAP 2902 are Inactive, i.e. not being accessed to input data on FDI 2806 and output data on FDO 2816. In state 3004, the FAP 2804 is Active to input data from FDI 2806 and output data on FDO 2816, via output circuit 2904, while the SAP 2902 is Inactive. In state 3006, the SAP 2902 is Active to input data from FDI 2806 and output data on FDO 2816, via output circuit 2904, while the FAP 2804 is Inactive. In state 3008, both the FAP 2804 and SAP 2902 are Active to input data from FDI 2806 and output data on FDO 2816 via output circuit 2904.

Although the disclosure has been described in detail, it should be understood that various changes, substitutions and alterations may be made without departing from the spirit and scope of the disclosure as defined by the appended claims.

ASPECTS

A method of inputting data to and outputting data from a test access port and a shadow access port within a device comprising the steps of inputting data to and outputting data from the test access port in response to the rising edge of a TCK signal and inputting data to and outputting data from the shadow access port in response to the falling edge of the TCK.

A shadow access port circuit for use in conjunction with a test access port circuit within a device comprising a state machine having an input coupled to a TMS signal that is also coupled to the test access port, an input coupled to a TCK signal that is also coupled to the test access port, and control outputs, an instruction register having control inputs coupled to the control outputs of the state machine, an input coupled to the TCK signal, an input coupled to a TDI signal that is also coupled to the test access port, and a data output, a data register having control inputs coupled to the control outputs of the state machine, an input coupled to the TCK signal, an input coupled to the TDI signal, and a data output; and a multiplexer having an input coupled to the data output of the instruction register, an input coupled to the data output of the data register, a control input coupled to the control outputs of the state machine, and a data output.

A shadow access port circuit for use in conjunction with a test access port circuit within a device comprising a state machine having an input coupled to a TMS signal that is also coupled to the test access port, an input coupled to a TCK signal that is also coupled to the test access port, and control outputs, an instruction register having control inputs, including a clock input, coupled to the control outputs of the state machine, an input coupled to a TDI signal that is also coupled to the test access port, and a data output, a data register having control inputs, including a clock input, coupled to the control outputs of the state machine, an input coupled to the TDI signal, and a data output; and a multiplexer having an input coupled to the data output of the instruction register, an input coupled to the data output of the data register, a control input coupled to the control outputs of the state machine, and a data output.

A state machine for operating a shadow access port circuit that is used in conjunction with a test access port within a device comprising a reset state, an idle state, a data register select state, a data register capture state, a data register shift state, a data register update state, an instruction register select state, an instruction register capture state, an instruction register shift state; and an instruction register update state.

An instruction register of a shadow access port that is used in conjunction with a test access port within a device comprising a shift register having an input coupled to a TDI signal that is also coupled to the test access port, parallel outputs, and an output coupled to a TDO signal that is also coupled to the test access port and an update register having parallel inputs coupled to the parallel outputs from the shift register.

A data register of a shadow access port that is used in conjunction with a test access port within a device comprising a shift register having an input coupled to a TDI signal that is also coupled to the test access port, parallel outputs, and an output coupled to a TDO signal that is also coupled to the test access port, and an update register having parallel inputs coupled to the parallel outputs from the shift register.

A data register of a shadow access port that is used in conjunction with a test access port within a device comprising a shift register having an input coupled to a TDI signal that is also coupled to the test access port, parallel outputs, and an output coupled to a TDO signal that is also coupled to the test access port.

A bypass register of a shadow access port that is used in conjunction with a test access port within a device comprising a single bit shift register having an input coupled to a TDI signal that is also coupled to the test access port and an output coupled to a TDO signal that is also coupled to the test access port.

A scan register of a shadow access port that is used in conjunction with a test access port within a device comprising a shift register having an input coupled to a TDI signal that is also coupled to the test access port, parallel inputs coupled to parallel outputs from a combination logic circuit to be tested, parallel outputs coupled to parallel inputs of the combinational logic circuit to be tested, and an output coupled to a TDO signal that is also coupled to the test access port.

A circuit for outputting data from a test access port and a shadow access port within a device comprising an enable input coupled to an enable output of the test access port, an enable input coupled to an enable output of the shadow access port, a data input coupled to a data output of the test access port, a data input coupled to a data output of the shadow access port, a clock input coupled to a TCK signal that is also coupled to a clock input of test access port and to a clock input of the shadow access port a clock doubler circuit having a clock input coupled to the TCK signal and a clock output operating at two times the frequency of the TCK input signal, and a data output for outputting data from the test access port during a first period of the clock output from the clock doubler circuit and for outputting data from the shadow access port during a second period of the clock output from the clock doubler circuit.

A device comprising a TDI input lead, a TMS input lead, a TCK input lead, a TDO output lead, a test access port having inputs coupled to the TDI, TMS and TCK device input leads, a data output, and an enable output, a shadow access port having inputs coupled to the TDI, TMS and TCK device input leads, a data output, and an enable output, and an output circuit having an input coupled to the data output of the test access port, an input coupled to the enable output of the test access port, an input coupled to the data output of the shadow access port, an input coupled to the enable output of the shadow access port, and an output coupled to the TDO device output lead.

Modes of operating a test access port and a shadow access port within a device for inputting data from a TDI input lead of the device and outputting data to a TDO output lead of the device comprising the steps of operating in a first mode whereby the test access port inputs data from the TDI input lead and outputs data to the TDO output lead, and operating in a second mode whereby the shadow access port inputs data from the TDI input lead and outputs data to the TDO output lead.

The modes of operating the test access port and a shadow access port further including operating in a third mode whereby both the test access port and shadow access port input data from the TDI input lead and output data to the TDO output lead.

A circuit for selectively outputting data from either a test access port or a shadow access port within a device comprising an enable input coupled to an enable output of the test access port, an enable input coupled to an enable output of the shadow access port, a data input coupled to a data output of the test access port, a data input coupled to a data output of the shadow access port, a clock input coupled to a TCK signal that is also coupled to a clock input of the test access port and to a clock input of the shadow access port, and a data output for outputting data from the test access port when the test access port's enable output is active and the shadow access port's enable output is inactive, and for outputting data from the shadow access port when the shadow access port's enable output is active and the test access port's enable output is inactive.

A shadow access port within a device and associated with a test access port also within the device, the shadow access port comprising an input coupled to a TDI device input lead, an input coupled to a TMS device input lead, an input coupled to a TCK device input lead, parallel inputs coupled to parallel outputs of functional circuitry within the device, parallel outputs coupled to parallel inputs of functional circuitry within the device; and an output coupled to a TDO device output lead.

A shadow access port within a device and associated with a test access port also within the device, the shadow access port comprising; an input coupled to a TDI device input lead, an input coupled to a TMS device input lead, an input coupled to a TCK device input lead, parallel inputs coupled to parallel outputs of debug circuitry within the device, parallel outputs coupled to parallel inputs of debug circuitry within the device, and an output coupled to a TDO device output lead.

A shadow access port within a device and associated with a test access port also within the device, the shadow access port comprising an input coupled to a TDI device input lead, an input coupled to a TMS device input lead, an input coupled to a TCK device input lead, parallel inputs coupled to parallel outputs of trace circuitry within the device, parallel outputs coupled to parallel inputs of trace circuitry within the device, and an output coupled to a TDO device output lead.

A shadow access port within a device and associated with a test access port also within the device, the shadow access port comprising an input coupled to a TDI device input lead, an input coupled to a TMS device input lead, an input coupled to a TCK device input lead, parallel inputs coupled to parallel outputs of programming circuitry within the device, parallel outputs coupled to parallel inputs of programming circuitry within the device; and an output coupled to a TDO device output lead.

A shadow access port within a device and associated with a test access port also within the device, the shadow access port comprising; an input coupled to a TDI device input lead, an input coupled to a TMS device input lead, an input coupled to a TCK device input lead, parallel inputs coupled to parallel outputs of user defined circuitry within the device, parallel outputs coupled to parallel inputs of user defined circuitry within the device, and an output coupled to a TDO device output lead.

A shadow access port within a device and associated with a test access port also within the device, the shadow access port being designed to operate as a secondary test access port comprising an input coupled to a TDI device input lead, an input coupled to a TMS device input lead, an input coupled to a TCK device input lead, parallel inputs coupled to parallel outputs of one of a test, debug, trace and programming circuit within the device, parallel outputs coupled to parallel inputs of one of a test, debug, trace, and programming circuit within the device and an output coupled to a TDO device output lead.

A device comprising a TDI input lead, a TMS input lead, a TCK input lead, a TDO output lead, a first test access port having an input coupled to the TDI input lead, an input coupled to the TMS input lead, an input coupled to the TCK input lead, and a data output, an inverter having an input coupled to the TCK input lead and an output, a second test access port having an input coupled to the TDI input lead, an input coupled to the TMS input lead, an input coupled to the output of the inverter, and a data output, and an output circuit having an input coupled to the data output of the first test access port, and input coupled to the data output of the second test access port, and an output coupled to the TDO output lead.

An electronic system comprising a TAP controller having a TDI output, a TCK output, a TMS output, and a TDO input, a device comprising a TDI input lead, a TCK input lead, a TMS input lead, and a TDO output lead, a test access port within the device and coupled to the TDI input lead, the TCK input lead, the TMS input lead, and the TDO output lead, a shadow access port within the device and coupled to the TDI input lead, the TCK input lead, the TMS input lead, and the TDO output lead, a first connection formed between the TDI output of the TAP controller and the TDI input lead of the device, a second connection formed between the TCK output of the TAP controller and the TCK input lead of the device, a third connection formed between the TMS output of the TAP controller and the TMS input lead of the device, and a fourth connection formed between the TDO output lead of the device and the TDO input of the TAP controller.

An electronic system arrangement comprising a TAP controller having a TDI output, a TCK output, a first TMS output, a second TMS output, and a TDO input, a first device having a TDI input lead, a TCK input lead, a TMS input lead, and a TDO output lead, a test access port within the first device and coupled to the TDI input lead, the TCK input lead, the TMS input lead, and the TDO output lead of the first device, a shadow access port within the first device and coupled to the TDI input lead, the TCK input lead, the TMS input lead, and the TDO output lead of the first device, a second device comprising a TDI input lead, a TCK input lead, a TMS input lead, and a TDO output lead, a test access port within the second device and coupled to the TDI input lead, the TCK input lead, the TMS input lead, and the TDO output lead of the second device, a shadow access port within the second device and coupled to the TDI input lead, the TCK input lead, the TMS input lead, and the TDO output lead of the second device, a first connection formed between the TDI output of the TAP controller and the TDI input leads of the first and second devices, a second connection formed between the TCK output of the TAP controller and the TCK input leads of the first and second devices, a third connection formed between the first TMS output of the TAP controller and the TMS input lead of the first device, a fourth connection formed between the second TMS output of the TAP controller and the TMS input lead of the second device, and a fifth connection formed between the TDO output leads of the first and second devices and the TDO input of the TAP controller.

An electronic system arrangement comprising a TAP controller having a TDI output, a TCK output, a TMS output, and a TDO input, a first device having a TDI input lead, a TCK input lead, a TMS input lead, and a TDO output lead, a test access port within the first device and coupled to the TDI input lead, the TCK input lead, the TMS input lead, and the TDO output lead of the first device, a shadow access port within the first device and coupled to the TDI input lead, the TCK input lead, the TMS input lead, and the TDO output lead of the first device, a second device comprising a TDI input lead, a TCK input lead, a TMS input lead, and a TDO output lead, a test access port within the second device and coupled to the TDI input lead, the TCK input lead, the TMS input lead, and the TDO output lead of the second device, a shadow access port within the second device and coupled to the TDI input lead, the TCK input lead, the TMS input lead, and the TDO output lead of the second device, a first connection formed between the TDI output of the TAP controller and the TDI input lead of the first device, a second connection formed between the TCK output of the TAP controller and the TCK input leads of the first and second devices, a third connection formed between the TMS output of the TAP controller and the TMS input leads of the first and second devices, a fourth connection formed between the TDO output lead of the first device and the TDI input lead of the second device, and a fifth connection for directly or indirectly coupling the TDO output lead of the second device to the TDO input of the TAP controller.

A device comprising a functional data input lead, a functional control input lead, a functional clock input lead, a functional data output lead, a functional access port having inputs coupled to the functional data input lead, functional control input lead, functional clock input lead, a data output, and an enable output, a shadow access port having inputs coupled to the functional data input lead, functional control input lead, functional clock input lead, a data output, and an enable output, and an output circuit having an input coupled to the data output of the functional access port, an input coupled to the enable output of the functional access port, an input coupled to the data output of the shadow access port, an input coupled to the enable output of the shadow access port, and an output coupled to the functional data output lead.

Modes of operating a functional access port and a shadow access port within a device for inputting data from a functional data input lead of the device and outputting data to a functional data output lead of the device comprising the steps of operating in a first mode whereby the functional access port inputs data from the functional data input lead and outputs data to the functional data output lead, and operating in a second mode whereby the shadow access port inputs data from the functional data input lead and outputs data to the functional data output lead.

The modes of operating the functional access port and a shadow access port further including operating in a third mode whereby both the functional access port and shadow access port input data from the functional data input lead and output data to the functional data output lead.

I claim:

1. An integrated circuit comprising:
   (a) a TCK lead, a TMS lead, a TDI lead, and a TDO lead;
   (b) a test access port circuit having a TCK input connected to the TCK lead, a TMS input connected to the TMS lead, a TDI input connected to the TDI lead, a TDO output connected to the TDO lead, a data register and an instruction register that are connected to the TDI input and that are selectively coupled to the TDO output, and a port state machine that is connected to the TCK input, the TMS input, the data register and the instruction register, the port state machine changing states upon a rising edge of a clock signal on the TCK lead;
   (c) an inverter having an input connected to the TCK lead and an output; and
   (d) a shadow access port circuit having a TCK input connected to the output of the inverter, a TMS input connected to the TMS lead, a TDI input connected to the TDI lead, a TDO output connected to the TDO lead, a data register and an instruction register that are connected to the TDI input, that are selectively coupled to the TDO output, and a shadow state machine that is connected to the TCK input, the TMS input, the data register and the instruction register, the shadow state machine changing states upon a falling edge of a clock signal on the TCK lead, the data register and the instruction register having clock inputs that are coupled to the output of the inverter.

2. The integrated circuit of claim 1 in which the state machine of the test access port circuit steps through the states of SELECT-DR, CAPTURE-DR, SHIFT-DR, EXIT1-DR, PAUSE-DR, EXIT2-DR, and UPDATE-DR.

3. The integrated circuit of claim 1 in which the state machine of the shadow access port circuit steps through the states of SELECT-DR, CAPTURE-DR, SHIFT-DR, and UPDATE-DR without shifting through states of EXIT1-DR, PAUSE-DR, or EXIT2-DR.

4. The integrated circuit of claim 1 in which the state machines of both access port circuits have a RESET state and an IDLE state.

* * * * *